(12) United States Patent
Carter et al.

(10) Patent No.: US 8,771,525 B2
(45) Date of Patent: Jul. 8, 2014

(54) ROTARY NANOTUBE BEARING STRUCTURE AND METHODS FOR MANUFACTURING AND USING THE SAME

(71) Applicant: The Charles Stark Draper Laboratory, Inc., Cambridge, MA (US)

(72) Inventors: David J. Carter, Concord, MA (US); Marc S. Weinberg, Needham, MA (US); Eugene Cook, Melrose, MA (US); Peter Miraglia, Weymouth, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 13/681,613

(22) Filed: Nov. 20, 2012

(65) Prior Publication Data

US 2013/0098866 A1    Apr. 25, 2013

Related U.S. Application Data

(62) Division of application No. 12/370,565, filed on Feb. 12, 2009, now Pat. No. 8,337,141.

(60) Provisional application No. 61/028,851, filed on Feb. 14, 2008.

(51) Int. Cl.
| | |
|---|---|
| *C23F 1/00* | (2006.01) |
| *B44C 1/22* | (2006.01) |
| *F16C 33/04* | (2006.01) |
| *B81C 1/00* | (2006.01) |
| *F04B 19/00* | (2006.01) |

(52) U.S. Cl.
CPC ............. *F16C 33/04* (2013.01); *B81C 1/00198* (2013.01); *F04B 19/006* (2013.01)
USPC ........ 216/2; 216/13; 216/58; 216/79; 216/83; 427/255.28; 427/270

(58) Field of Classification Search
USPC .......... 216/2, 13, 83, 58, 79; 427/255.28, 270
See application file for complete search history.

(56) References Cited

U.S. PATENT DOCUMENTS

| | | | |
|---|---|---|---|
| 5,180,940 | A | 1/1993 | Paratte et al. |
| 5,252,881 | A | 10/1993 | Muller et al. |
| 5,417,801 | A | 5/1995 | Bol |
| 5,510,299 | A | 4/1996 | Li et al. |

(Continued)

FOREIGN PATENT DOCUMENTS

| | | |
|---|---|---|
| WO | 02080360 A1 | 10/2002 |
| WO | WO-02080360 A1 | 10/2002 |

OTHER PUBLICATIONS

Yu "Controlled Sliding and Pullout of Nested Shells in Individual Multiwalled Carbon Nanotubes," Journal of Physical Chemistry B, vol. 104, 2000, pp. 8764-8767.

(Continued)

*Primary Examiner* — Shamim Ahmed
(74) *Attorney, Agent, or Firm* — Lando & Anastasi, LLP

(57) ABSTRACT

In one embodiment, a rotary device includes a multiwall nanotube that extends substantially perpendicularly from a substrate. A rotor may be coupled to an outer wall of the multiwall nanotube, be spaced apart from the substrate, and be free to rotate around an elongate axis of the multiwall nanotube.

12 Claims, 24 Drawing Sheets

A. GROW MWNT    B. DEPOSIT RELEASE LAYER

C. DEPOSIT ROTOR MATERIAL    D. PATTERN ROTOR

E. RELEASE ROTOR

(56) References Cited

U.S. PATENT DOCUMENTS

| | | | |
|---|---|---|---|
| 5,535,902 A | 7/1996 | Greiff | |
| 5,600,190 A | 2/1997 | Zettler | |
| 5,705,318 A | 1/1998 | Mehregany et al. | |
| 5,955,818 A | 9/1999 | Bertin et al. | |
| 6,615,681 B1 | 9/2003 | Jenkins et al. | |
| 7,053,520 B2 | 5/2006 | Zetti et al. | |
| 7,088,019 B2 | 8/2006 | Takada et al. | |
| 7,238,425 B2 | 7/2007 | Cumings et al. | |
| 7,239,054 B2 | 7/2007 | Takada et al. | |
| 7,453,183 B2 | 11/2008 | Zettl et al. | |
| 7,582,992 B2 | 9/2009 | Pinkerton et al. | |
| 8,427,039 B2* | 4/2013 | Legagneux et al. | 313/311 |
| 2002/0096018 A1 | 7/2002 | Rodgers et al. | |
| 2003/0062332 A1* | 4/2003 | Harris et al. | 216/2 |
| 2003/0082928 A1* | 5/2003 | Knieser et al. | 438/800 |
| 2004/0119354 A1 | 6/2004 | Takada et al. | |
| 2005/0017598 A1 | 1/2005 | Zettl et al. | |
| 2005/0035671 A1 | 2/2005 | Takada et al. | |
| 2006/0010871 A1 | 1/2006 | Frechette et al. | |
| 2006/0231381 A1 | 10/2006 | Jensen et al. | |
| 2007/0026636 A1 | 2/2007 | Gogoi | |
| 2007/0114880 A1 | 5/2007 | Zettl et al. | |
| 2009/0278556 A1* | 11/2009 | Man et al. | 324/693 |

OTHER PUBLICATIONS

Zhang et al. "Atomistic Simulations of Double-Walled Carbon Nanotubes (DWCNTs) as Rotational Bearings," Nano Lett., vol. 4, No. 2, 2004, pp. 293-297.
Zhang et al. "Velocity Plateaus and Jumps in Carbon Nanotube Sliding," Surface Science, vol. 601, No. 18,2007, pp. 3693-3696.
International Search Report for PCT Application No. PCT/US2009/033972, mailed Jan. 27, 2010, 6 pages.
Written Opinion for PCT Application No. PCT/US2009/033972, mailed Jan. 27, 2010, 10 pages.
Akita et al., "Mechanical and Electrical Properties of Multiwall Nanotube Under Interlayer Sliding" e-Journal of Surface Science and Nanotechnology, vol. 3, 2005, pp. 86-93.
Behler et al., "Effect of Thermal Treatment on the Structure of Multi-Walled Carbon Nanotubes," Journal of Nanoparticle Research, vol. 8, No. 5, 2006, pp. 615-625.
Berber et al., "Stability Differences and Conversion Mechanism Between Nanotubes and Scrolls," Physical Review B, vol. 69, No. 23, 2004, pp. 233404-1-233404-4.
Bourlon et al., "Carbon Nanotube Based Bearing for Rotational Motions," Nano Letters, vol. 4, No. 4, 2004, pp. 709-712.
Charlier et al., "Structural and Electronic Properties of Pentagon-Heptagon Pair Defects in Carbon Nanotubes," Physical Review B, vol. 53, No. 16, Apr. 16, 1996, pp. 11108-11113.
Charlier, "Defects in Carbon Nanotubes," Accounts of Chemical Research, vol. 36, No. 12, 2002, pp. 1063-1069.
Che et al., "Therml Conductivity of Carbon Nanotubes," nanotechnology, vol. 11, 2000, pp. 65-69.
Chen et al., "High-Bias-Induced Structure and the Corresponding Electronic Property Changes in Carbon Nanotubes," Applied Physics Letters, 2005, vol. 87, No. 26, pp. 263107-1-263107-3.
Chico, et al, "Pure Carbon Nanoscale Devices: Nanotube Heterojunctions," Physical Review Letters, vol. 76, No. 6, Feb. 5, 1996, pp. 971-974.
Collins et al, "Engineering Carbon Nanotubes and Nanotube Circuits Using Electrical Breakdown," Science, vol. 292, No. 5517, Apr. 27, 2001, pp. 706-709.
Cook, "A Carbon Nanotube Bearing and Stodola Rotor," Thesis for the Department of Aeronautics and Astronautics, Massachusetts Institute of Technology, Sep. 2008, pp. 1-181.
Cumings et al, "Low-Friction Nanoscale Linear Bearing Realized from Multiwall Carbon Nanotubes," Science, vol. 289, No. 5479, Jul. 28, 2000, pp. 602-604.
Dai, "Nanotube Growth and Characterization," Carbon Nanotubes: Synthesis, Structure, Properties, and Applications, M.S. Dresselhaus, G. Dresselhaus, and P. Avouris, Eds., New York, 2001, pp. 29-53.

El-Barbary et al., "Structure and Energetics of the Vacancy in Graphite," Physical Review B, vol. 68, No. 14, 2003, pp. 144107-1-144107-7.
Feng et al, "The HREM Observation of Cross-Sectional Structure of Carbon Nanotubes," Journal of Physics and Chemistry of Solids, vol. 58, No. 11, 1997, pp. 1887-1892.
Fennimore et al, "Rotational Actuators Based on Carbon Nnotubes," Nature, vol. 424, Jul. 24, 2003, pp. 408-410.
Fennimore, "Electrically Driven Vaporization of Multiwall Carbon Nanotubes for Rotary Bearing Creation," Electronic Properties of Synthetic Nanostructures, 2004, pp. 587-590.
Forro et al, "Physical Properties of Multi-Wall Nanotubes," Carbon Nanotubes: Synthesis, Structure, Properties, and Applications, M.S. Dresselhaus, G. Dresselhaus, and P. Avouris, Eds., New York: Spinger-Verlaq, 2001, pp. 329-391.
Guo et al, "Energy Dissipation in Gigahertz Oscillators from Multiwalled Carbon Nanotubes," Physical Review Letters, vol. 91, No. 12, Sep. 19, 2003, pp. 125501-1-125501-4.
Guo et al., "Coupled Defect-Size Effects on Interlayer Friction in Multiwalled Carbon Nanotubes," Physical Review B (Condensed Matter and Materials Physics), vol. 72, No. 7, 2005, pp. 075409-1-075409-10.
Guo et al., "Optimized Bearing and Interlayer Friction in Multiwalled Carbon Nanotubes," Computer Modeling in Engineering & Sciences, vol. 7, No. 1, 2005, pp. 19-34.
Huang et al., "Growth of Large Periodic Arrays of Carbon Nanotubes," Applied Physics Letters, vol. 82, No. 3, Jan. 20, 2003, pp. 460-462.
Huang et al., "Real-Time Observation of Tubule Formation from Amorphous Carbon Nanowires Under High-Bias Joule Heating," Nano Lett., vol. 6, No. 8, 2006, pp. 1699-1705.
Huhtala et al., "Improved Mechanical Load Transfer Between Shells of Multiwalled Carbon Nanotubes," Physical Review B, vol. 70, No. 4, 2004, p. 045404-1-045404-8.
Iijima, "Helical Microtubes of Graphitic Carbon," Nature, vol. 354, Nov. 7, 1991, pp. 56-58.
Jensen et al., "Current-Controlled Nanotube Growth and Zone Refinement," Applied Physics Letters, vol. 86, No. 17, 2005, pp. 173107-1-173107-3.
Ji et al., "A High-Throughput Nanohole-Array Based System to Monitor Multiple Binding Events in Real Time," Analytical Chemistry, vol. 8, No. 7, Apr. 1, 2008, pp. 2491-2498.
Jones, "The Future of Nanotechnology," Physics World, Aug. 2004, pp. 25-29.
Kis et al., "Interlayer Forces and Ultralow Sliding Friction in Multiwalled Carbon Nanotubes," Physical Review Letters, vol. 97, No. 2, Jul. 14, 2006, pp. 025501-1-025501-4.
Krasheninnikov et al., "Stability of Irradiation-Induced Point Defects on Walls of Carbon Nanotubes," Journal of Vacuum Science & Technology B: Microelectronics and Nanometer Structures, vol. 20, No. 2, Mar./Apr. 2002, pp. 728-733.
Mehregany et al., "A Study of Three Microfabricated Variable-Capacitance Motors," Sensors Actuators, vol. A21-A23, 1990, pp. 173-179.
Melechko et al. "Vertically Aligned Carbon Nanofibers and Related Structures: Controlled Synthesis and Directed Assembly," Journal of Applied Physics, vol. 97, No. 4, 2005, pp. 041301-1-041301-39.
Merkulov et al. "Alignment Mechanism of Carbon Nanofibers Produced by Plasma-Enhanced Chemical-Vapor Deposition," Applied Physics Letters, vol. 79, No. 18, Oct. 29, 2001, pp. 2970-2972.
Murakoshi et al. "Eiectroststically Levitated Ring-Shaped Rotational-Gyro/Accelerometer," Japanese Journal of Applied Physics, vol. 42, No. 48, Apr. 2003, pp. 2468-2472.
Muthuswami et al. "Nanomechanical Imaging of Multi-Walled Carbon Nanotubes," Materials Research Society Symposium Proceedures, vol. 778,2003, U5.10, pp. 151-156.
Ornata et al. "Nanotube Nanoscience: A Molecular-Dynamics Study," Physica E: Low-Dimensional Systems and Nanostructures, vol. 29, No. 3-4, 2005, pp. 454-468.
Ren et al. "Growth of a Single Freestanding Multiwall Carbon Nanotube on Each Nanonickel Dot," Applied Physics Letters, vol. 75, No. 8, 1999, pp. 1086-1088.

(56) References Cited

OTHER PUBLICATIONS

Ren et al. "Synthesis of Large Arrays of Well-Aligned Carbon Nanotubes on Glass," Science, vol. 282, No. 5391, Nov. 6, 1998, pp. 1105-1107.
Rivera et al. "Oscillatory Behavior of Double Nanotubes under Extension: A Simple Nanoscale Damped Spring." Nano Lett., vol. 3, No. 8, 2003, pp. 1001-1005.
Salvetat et al. "Mechanical Properties of Carbon Nanotubes," Applied Physics A: Materials Science & Processinq, vol. 69, No. 3, 1999, pp. 255-260.
Soule et al. "Direct Basal-Plane Shear in Single-Crystal Graphite," Journal of Applied Physics, vol. 39, No. 11, Oct. 1968, pp. 5122-5139.
Stone et al. "Theoretical Studies of Icosahedral and Some Related Species," Chemical Physics Letters, vol. 128, No. 5-6, Aug. 8, 1986, pp. 501-503.
Subramanian et al. "Batch Fabrication of Carbon Nanotube Bearings," Nanotechnology, 18, No. 7, 2007, 075703, pp. 1-9.
Suet al. "Dynamic Friction Force in a Carbon Peapod Oscillator," Nanotechnology, vol. 17, No. 22, 2006, pp. 5691-5695.
Tavrow et al. "Operational Characteristics of Microfabricated Electric Motors," Solid-State Sensors and Actuators, 1991, Digest of Technical Papers, Transducers'91, 1991 International Conference on, pp. 877-881.
Telling et al. "Wigner Defects Bridge the Graphite Gap," Nat. Mater, vol. 2, No. 5, May 2003, pp. 333-337.
Tu et al. "Growth of Aligned Carbon Nanotubes with Controlled Site Density," Applied Physics Letters, vol. 80, No. 21, May 27, 2002, pp. 4018-4020.
Waters "Shell Buckling of Individual Multiwalled Carbon Nanotubes Using Nanoindentation," Applied Physics Letters, vol. 87, 2005, pp. 103109-1 to 103109-3.
Wen "Growth and Characterization of Aligned Carbon Nanotubes from Patterned Nickel Nanobots and Uniform Thin Films," J. Mater. Res., vol. 16, No. 11, Nov. 2001, pp. 3246-3253.
Yakobson et al. "Mechanical Properties of Carbon Nanotubes," Carbon Nanotubes: Synthesis, Structure, Properties, and Applications, M. S. Dresselhaus, G. Dresselhaus, and P. Avouris, Eds., New York, Springer-Verlag, 2001, pp. 287-327.
Akita et al. "Mechanical and Electrical Properties of Multiwall Nanotube Under Interlayer Sliding," e-Journal of Surface Science and Nanotechnology, vol. 3, 2005, pp. 86-93.
Behler et al. "Effect of Thermal Treatment on the Structure of Multi-Walled Carbon Nanotubes," Journal of Nanoparticle Research, vol. 8, No. 5, 2006, pp. 615-625.
Berber et al. "Stability Differences and Conversion Mechanism Between Nanotubes and Scrolls," Physical Review B, vol. 69, No. 23, 2004, pp. 233404-1-233404-4.
Bourlon et al. "Carbon Nanotube Based Bearing for Rotational Motions," Nano Letters, vol. 4, No. 4, 2004, pp. 709-712.
Charlier "Defects in Carbon Nanotubes," Accounts of Chemical Research, vol. 35, No. 12, 2002, pp. 1063-1069.
Charlier et al. "Structural and Electronic Properties of Pentagon-Heptagon Pair Defects in Carbon Nanotubes," Physical Review B, vol. 53, No. 16, Apr. 16, 1996, pp. 11108-11113.
Che et al. "Thermal Conductivity of Carbon Nanotubes." Nanotechnology, vol. 11, 2000, pp. 65-69.
Chen et al. "High-Bias-Induced Structure and the Corresponding Electronic Property Changes in Carbon Nanotubes," Applied Physics Letters, 2005, vol. 87, No. 26, pp. 263107-1-263107-3.
Chico et al. "Pure Carbon Nanoscale Devices: Nanotube Heterojunctions," Physical Review Letters, vol. 76, No. 6, Feb. 5, 1996, pp. 971-974.
Collins et al. "Engineering Carbon Nanotubes and Nanotube Circuits Using Electrical Breakdown," Science, vol. 292, No. 5517, Apr. 27, 2001, pp. 706-709.
Cook "A Carbon Nanotube Bearing and Stodola Rotor," Thesis for the Department of Aeronautics and Astronautics, Massachusetts Institute of Technology, Sep. 2008, pp. 1-181.

Cumings et al. "Low-Friction Nanoscale Linear Bearing Realized from Multiwall Carbon Nanotubes," Science, vol. 289, No. 5479, Jul. 28, 2000, pp. 602-604.
Dai, "Nanotube Growth and Characterization," Carbon Nanotubes: Synthesis, Structure, Properties, and Applications, M. S. Dresselhaus, G. Dresselhaus, and P. Avouris, Eds., New York, 2001, pp. 29-53.
El-Barbary et al. "Structure and Energetics of the Vacancy in Graphite," Physical Review B, vol. 68, No. 14, 2003, pp. 144107-1-144107-7.
Feng et al. "The HREM Observation of Cross-Sectional Structure of Carbon Nanotubes," Journal of Physics and Chemistry of Solids, vol. 58, No. 11, 1997, pp. 1887-1892.
Fennimore "Electrically Driven Vaporization of Multiwall Carbon Nanotubes for Rotary Bearing Creation," Electronic Properties of Synthetic Nanostructures, 2004, pp. 587-590.
Fennimore et al. "Rotational Actuators Based on Carbon Nanotubes," Nature, vol. 424, Jul. 24, 2003, pp. 408-410.
Forró et al. "Physical Properties of Multi-Wall Nanotubes," Carbon Nanotubes: Synthesis, Structure, Properties, and Applications, M. S. Dresselhaus, G. Dresselhaus, and P. Avouris, Eds., New York: Springer-Verlag, 2001, pp. 329-391.
Guo et al. "Coupled Defect-Size Effects on Interlayer Friction in Multiwalled Carbon Nanotubes," Physical Review B (Condensed Matter and Materials Physics), vol. 72, No. 7, 2005, pp. 075409-1-075409-10.
Guo et al. "Energy Dissipation in Gigahertz Oscillators from Multiwalled Carbon Nanotubes." Physical Review Letters, vol. 91, No. 12, Sep. 19, 2003, pp. 125501-1-125501-4.
Guo et al. "Optimized Bearing and Interlayer Friction in Multiwalled Carbon Nanotubes," Computer Modeling in Engineering & Sciences, vol. 7, No. 1, 2005, pp. 19-34.
Huang et al. "Growth of Large Periodic Arrays of Carbon Nanotubes," Applied Physics Letters, vol. 82, No. 3, Jan. 20, 2003, pp. 460-462.
Huang et al. "Real-Time Observation of Tubule Formation from Amorphous Carbon Nanowires Under High-Bias Joule Heating," Nano Lett., vol. 6, No. 8, 2006, pp. 1699-1705.
Huhtala et al. "Improved Mechanical Load Transfer Between Shells of Multiwalled Carbon Nanotubes," Physical Review B, vol. 70, No. 4, 2004, p. 045404-1-045404-8.
Iijima "Helical Microtubules of Graphitic Carbon," Nature, vol. 354, Nov. 7, 1991, pp. 56-58.
Jensen et al. "Current-Controlled Nanotube Growth and Zone Refinement," Applied Physics Letters, vol. 86, No. 17, 2005, pp. 173107-1-173107-3.
Ji et al. "A High-Throughput Nanohole-Array Based System to Monitor Multiple Binding Events in Real Time" Analytical Chemistry, vol. 8, No. 7, Apr. 1, 2008, pp. 2491-2498.
Jones "The Future of Nanotechnology," Physics World, Aug. 2004, pp. 25-29.
Kis et al. "Interlayer Forces and Ultralow Sliding Friction in Multiwalled Carbon Nanotubes," Physical Review Letters, vol. 97, No. 2, Jul. 14, 2006, pp. 025501-1-025501-4.
Krasheninnikov et al. "Stability of Irradiation-Induced Point Defects on Walls of Carbon Nanotubes," Journal of Vacuum Science & Technology B: Microelectronics and Nanometer Structures, vol. 20, No. 2, Mar./Apr. 2002, pp. 728-733.
Mehregany et al. "A Study of Three Microfabricated Variable-Capacitance Motors," Sensors Actuators, vol. A21-A23, 1990, pp. 173-179.
Murakoshi et al. "Electroststically Levitated Ring-Shaped Rotational-Gyro/Accelerometer," Japanese Journal of Applied Physics, vol. 42, No. 4B, Apr. 2003, pp. 2468-2472.
Muthuswami et al. "Nanomechanical Imaging of Multi-Walled Carbon Nanotubes," Materials Research Society Symposium Proceedures, vol. 778, 2003, U5.10, pp. 151-156.
Omata et al. "Nanotube Nanoscience: A Molecular-Dynamics Study," Physica E: Low-Dimensional Systems and Nanostructures, vol. 29, No. 3-4, 2005, pp. 454-468.
Salvetat et al. "Mechanical Properties of Carbon Nanotubes," Applied Physics A: Materials Science & Processing, vol. 69, No. 3, 1999, pp. 255-260.

(56) References Cited

OTHER PUBLICATIONS

Stone et al. "Theoretical Studies of Icosahedral C60 and Some Related Species," Chemical Physics Letters, vol. 128, No. 5-6, Aug. 8, 1986, pp. 501-503.

Su et al. "Dynamic Friction Force in a Carbon Peapod Oscillator," Nanotechnology, vol. 17, No. 22, 2006, pp. 5691-5695.

Zhang et al. "Velocity Plateaus and Jumps in Carbon Nanotube Sliding," Surface Science, vol. 601, No. 18, 2007, pp. 3693-3696.

* cited by examiner

A. GROW MWNT

B. DEPOSIT RELEASE LAYER

C. DEPOSIT ROTOR MATERIAL

D. PATTERN ROTOR

E. RELEASE ROTOR

ROTARY NANOTUBE BEARING STRUCTURE AND METHODS FOR MANUFACTURING AND USING THE SAME

CROSS-REFERENCE TO RELATED APPLICATIONS

This application is a divisional of, and incorporates herein by reference in its entirety, U.S. patent application Ser. No. 12/370,565, now U.S. Pat. No. 8,337,141 which was filed on Feb. 12, 2009. U.S. patent application Ser. No. 12/370,565 claims priority to and the benefit of U.S. Provisional Patent Application No. 61/028,851, which was filed on Feb. 14, 2008 and is also incorporated herein by reference in its entirety.

TECHNICAL FIELD

In various embodiments, the present invention relates to a rotary nanotube bearing structure and to methods for manufacturing and using the same.

BACKGROUND

Commercial micro-electro-mechanical systems ("MEMS") now reach the sub-millimeter to micrometer size scale. There is, however, also great interest in nanometer scale electromechanical systems. Nanostructures are of great interest not only for their basic scientific richness, but also because they have the potential to revolutionize critical technologies.

Certain types of bearing structures are employed in MEMS and nano-electro-mechanical systems ("NEMS") to allow for relative motion (e.g., linear or rotational) between two parts, but each has its limitations. For example, silicon-on-silicon sliding bearings generally have friction, lifetime, and debris issues. Gas bearings may have very low friction, but their design is typically complex and they generally are not operable in vacuum. For their part, ball bearings have size and wobble limitations.

Rotational actuators are of particular interest for several applications. For example, a dynamically tuned gyroscope, also known as a dry tuned gyroscope ("DTG"), typically includes a motor (e.g., an electromagnetic motor) that spins a shaft to which a rotor is attached. In some implementations, the shaft is supported by ball bearings. As mentioned, however, such ball bearings typically cannot be made small enough for some applications. In addition, they may consume greater amounts of power than desired due to undesirably high friction. Jeweled bearings and precisely machined pivots may be used instead, but, again, they typically increase the overall size of the DTG to larger than what is desired for many applications.

Rotational actuators that employ carbon nanotubes have been described. However, such actuators typically feature a rotor whose rotation axis is parallel to a top surface of the substrate. This arrangement is generally difficult to integrate with MEMS and NEMS processing, is difficult to manufacture, limits the applications of a device in which the actuator is employed, and limits the potential geometries for other features of the device (e.g., actuation and readout mechanisms).

Accordingly, needs exist for improved bearing structures and for methods of manufacturing and using the same.

SUMMARY OF THE INVENTION

Described herein are various embodiments of a rotary bearing that features a multiwall nanotube (e.g., a carbon nanotube that, as described below, includes an outer cylindrical wall and one or more concentric inner cylindrical walls). The multiwall nanotube may be attached to a substrate, and a rotor may be connected to the outer wall of the nanotube. In addition, a long axis of the nanotube may be oriented substantially perpendicular to a top surface of the substrate such that an axis of rotation of the rotor is also substantially perpendicular to the top surface of the substrate. Advantageously, this arrangement allows for well-controlled nanotube growth and/or placement, and integrated structure fabrication using standard MEMS/NEMS fabrication techniques. It also allows for the design of rotationally-symmetric rotors for high rotation speed, gives precise control over the rotor's geometry and mass (e.g., over its diameter and thickness), and enables the fabrication of relatively complex drive and sense mechanisms (e.g., multiple drive electrodes for an electrostatic drive, structures patterned above and below the rotor for an electrostatic or electromagnetic drive, and/or magnetic or capacitive readouts).

As described herein, various processes may be employed to fabricate embodiments of this rotary bearing structure. For example, a first fabrication process may be employed to manufacture a singly-supported bearing (i.e., Stodola rotor), and another, different fabrication process may be employed to manufacture a doubly-supported bearing.

In general, in one aspect, embodiments of the invention feature a rotary device that includes a substrate, a multiwall nanotube that is coupled to a top surface of the substrate and that extends substantially perpendicularly therefrom, and a rotor that is coupled to an outer wall of the multiwall nanotube. The rotor is spaced apart from the substrate and is free to rotate around an elongate axis of the multiwall nanotube. As used herein, the term "rotor" connotes any rotative member regardless of purpose or configuration. A rotor may drive a gear, provide inertia, serve as a collar to support another structure, or function in any of the various applications described herein.

In various embodiments, the multiwall nanotube comprises or consists essentially of carbon, while the substrate and/or rotor comprises or consists essentially of silicon. The highly-ordered graphitic crystalline structure of a carbon nanotube allows for a molecular-scale bearing structure. A first end of the multiwall nanotube may be coupled to the substrate, while a second end thereof may be coupled to a second support structure. The rotary device may also include means for actuating the rotor. For example, the rotor may be actuated by providing an electrostatic force, an electromagnetic force, a beam of photons, a beam of ions, and/or a jet of air, gas, or liquid.

In one embodiment, the rotor has an annular shape. In this case, the height of the rotor may range from approximately 100 nm to approximately 200 μm, while an outer diameter of the rotor may range from approximately 200 nm to approximately 1 mm. The rotor may be spaced from the substrate by approximately 50 nm to approximately 20 μm. For its part, the outer wall of the multiwall nanotube may have an outer diameter that ranges between approximately 10 nm and approximately 500 nm.

The rotary device may be, for example, a gyroscope, a flywheel energy storage mechanism, a pumping mechanism, a flow sensor, a turbomachine (such as a turbine or a gas compressor), an attitude control mechanism, or an optical chopper.

In general, in another aspect, embodiments of the invention feature a method for fabricating a rotary device. The method includes providing a multiwall nanotube on a substrate, growing a release layer on the substrate and around at least a portion of the nanotube, depositing rotor material on the release layer and around at least a portion of the nanotube, and removing at least a portion of the release layer between surfaces of the substrate and the rotor material so as to space the rotor from the substrate. The rotor remains coupled to the multiwall nanotube and is free to rotate about a long axis of the multiwall nanotube.

The multiwall nanotube may be provided by, for example, welding an arc-deposited or laser-ablated multiwall nanotube to the substrate or growing the multiwall nanotube on the substrate. In various embodiments, the multiwall nanotube is grown by plasma-enhanced chemical vapor deposition ("PECVD") on patterned catalyst particles, the release layer (e.g., silicon dioxide) is also grown by PECVD, the rotor material (e.g., silicon) is deposited by thermal chemical vapor deposition ("CVD"), and/or the release layer is removed by etching the release layer with vapor hydrofluoric acid. The method may further include patterning and etching the rotor material so as to shape the rotor, patterning and etching drive electrodes on the rotor material, and/or removing at least a portion of an outer wall of the multiwall nanotube that is located between the surfaces of the substrate and the rotor material.

In general, in yet another aspect, embodiments of the invention feature another method for fabricating a rotary device. In this method, a well is formed through a top sacrificial layer and into a bottom silicon layer of a silicon-insulator-silicon layered substrate having the top sacrificial layer deposited thereon. A multiwall nanotube is then provided therein. The method further includes forming a first release region around a first portion of the multiwall nanotube, rotor material over the first release region and around a second portion of the multiwall nanotube, a second release region over the rotor material and around a third portion of the multiwall nanotube, and a support structure over the second release region and around a fourth portion of the multiwall nanotube. The sacrificial layer, the insulator layer, the first release region, and the second release region may then be removed so as to space the rotor from the support structure and the bottom silicon layer. The rotor remains coupled to the multiwall nanotube and is free to rotate about a long axis of the multiwall nanotube.

In various embodiments, the multiwall nanotube is provided by, for example, welding an arc-deposited or laser-ablated multiwall nanotube to the bottom silicon layer of the well or growing the multiwall nanotube in the well (e.g., by PECVD on patterned catalyst particles). The rotor material and/or the support structure may comprise or consist essentially of silicon, while the sacrificial layer, the insulator layer, the first release region, and the second release region may comprise or consist essentially of silicon dioxide. For its part, the well may feature a stair-stepped configuration.

The method may further include patterning the sacrificial layer and the silicon-insulator-silicon layered substrate to form the well therein, securing a fifth portion of the multiwall nanotube to the bottom silicon layer of the substrate, and/or removing an outer wall of the multiwall nanotube around each of the first and third portions of the multiwall nanotube. Securing the fifth portion of the multiwall nanotube may involve depositing $SiN_x$ around the multiwall nanotube in a portion of the well formed in the bottom silicon layer of the substrate.

In general, in still another aspect, embodiments of the invention feature a dynamically tuned gyroscope that includes a multiwall carbon nanotube, a drive hub coupled to the multiwall carbon nanotube, a gimbal coupled to the drive hub, and a peripheral rotor coupled to the gimbal. The gyroscope may also include means for actuating the drive hub and the multiwall carbon nanotube. For example, the actuating means may provide either an electrostatic force or an electromagnetic force.

In general, in a further aspect, embodiments of the invention feature a pumping mechanism that includes i) a housing defining a cavity and ii) a rotary device located within the cavity. The cavity may include an inlet, an outlet, and a channel therebetween, while the rotary device may include a multiwall carbon nanotube coupled to a rotor. The rotor may propagate gas particles, that collide with a surface of the rotor, along the channel. In one embodiment, the pumping mechanism also includes means for actuating the rotor. For example, the actuating means may provide an electrostatic force to actuate the rotor.

These and other objects, along with advantages and features of the embodiments of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DESCRIPTION

Figure 1:
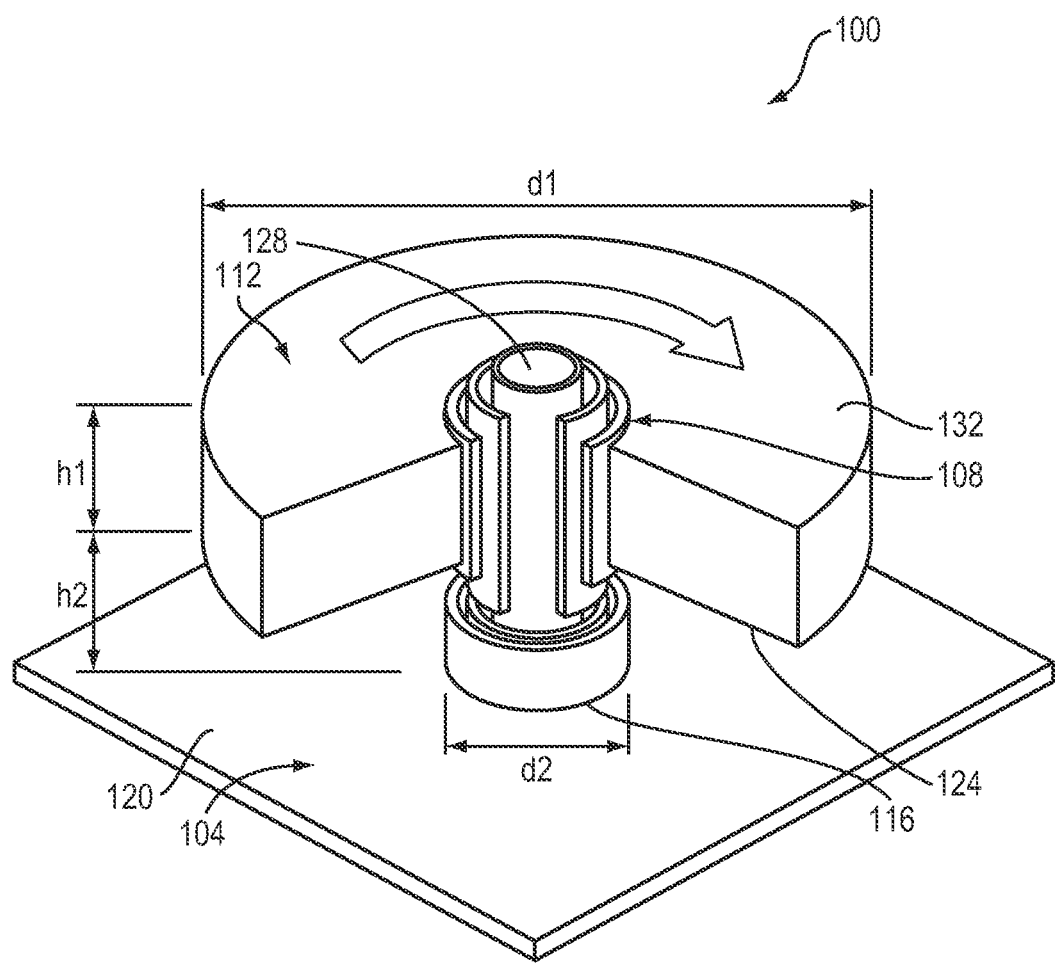
FIG. 1 is a cut-away view of a rotary device according to one embodiment of the invention.

In various embodiments, the present invention features a rotary device that employs a multiwall nanotube as a bearing and support structure for a rotor attached thereto. FIG. 1 depicts a cut-away view of one such exemplary rotary device 100. As illustrated, the rotary device 100 includes a substrate 104, an elongate multiwall nanotube 108, and a rotor 112. Notwithstanding the cut-away view of the rotary device 100 depicted in FIG. 1, the rotor 112 may be a complete, continuous annulus and each of the outer and two inner walls of the multiwall nanotube 108 may be a complete, continuous cylinder. Moreover, the multiwall nanotube 108 may include two, three, or any greater number of substantially cylindrical walls, and not simply the three substantially cylindrical walls illustrated in FIG. 1.

As illustrated, a first end 116 of the multiwall nanotube 108 may be coupled to a top surface 120 of the substrate 104 and extend substantially perpendicularly therefrom. For example, as further described below, the multiwall nanotube 108 may be grown on the top surface 120 of the substrate 104 such that the first end 116 of the multiwall nanotube 108 is integral with the top surface 120 of the substrate 104, or, alternatively, the multiwall nanotube 108 may be separately manufactured and the first end 116 thereof spot-welded or tack-welded to the top surface 120 of the substrate 104. For its part, the rotor 112 is coupled to an outer wall of the multiwall nanotube 108. The rotor 112 is spaced apart from the substrate 104 such that it is free to rotate around an elongate axis of the multiwall nanotube 108 (i.e., in a plane substantially parallel to the top surface 120 of the substrate 104).

Positioning the multiwall nanotube 108 substantially perpendicular to the substrate 104 allows for the design of a rotationally-symmetric rotor 112 for high rotation speed, gives precise control over rotor 112 geometry/mass (e.g., diameter and thickness control), and enables the fabrication of relatively complex drive and sense mechanisms (e.g., multiple drive electrodes for an electrostatic drive, structures patterned above and below the rotor 112 for an electrostatic or electromagnetic drive, and/or magnetic or capacitive readouts), as described below.

In one embodiment, as illustrated, the rotor 112 has the shape of an annulus. Alternatively, the rotor 112 may have other shapes. The height h1 of the annulus may range from approximately 100 nm to approximately 200 µm, while an outer diameter d1 of the annulus may range from approximately 200 nm to approximately 1 mm. The rotor 112 may be spaced from the substrate 104 (i.e., dimension h2 in FIG. 1) by approximately 50 nm to approximately 20 µm. For its part, the outer wall of the multiwall nanotube 108 may have an outer diameter d2 that ranges between approximately 10 nm and approximately 500 nm. In one particular embodiment, the annularly-shaped rotor 112 has a height h1 of approximately 2 µm, has an outer diameter d1 of approximately 20 µm, and is spaced from the top surface 120 of the substrate 104 by a distance h2 of approximately 2 µm, while the outer wall of the multiwall nanotube 108 has an outer diameter d2 of approximately 100 nm.

As illustrated in FIG. 1, bottom and top portions of one or more outer walls of the multiwall nanotube 108 (e.g., the portions between the first end 116 of the nanotube 108 and a bottom surface 124 of the rotor 112, and between a second, opposite end 128 of the nanotube 108 and a top surface 132 of the rotor 112) may be removed (e.g., mechanically sheared away or removed using electrical breakdown) so as to facilitate rotation of the rotor 112 about the elongate axis of the multiwall nanotube 108.

In one embodiment, the multiwall nanotube 108 comprises or consists essentially of carbon, while the substrate 104 and/or rotor 112 comprises or consists essentially of silicon or polysilicon. Alternatively, the multiwall nanotube 108 may comprise or consist essentially of other materials, such as boron-nitride. The mechanical and electrical properties of carbon and boron-nitride nanotubes renders them particularly suitable for service as active components in a moveable MEMS/NEMS device. For example, they feature a favorable elastic modulus and tensile strength, high thermal and electrical conductivity, low inter-shell friction (which is particularly desirable for rotation of an outer wall around an inner wall of the nanotube 108), and atomically smooth surfaces (i.e., without roughness larger than atoms).

Figure 2:
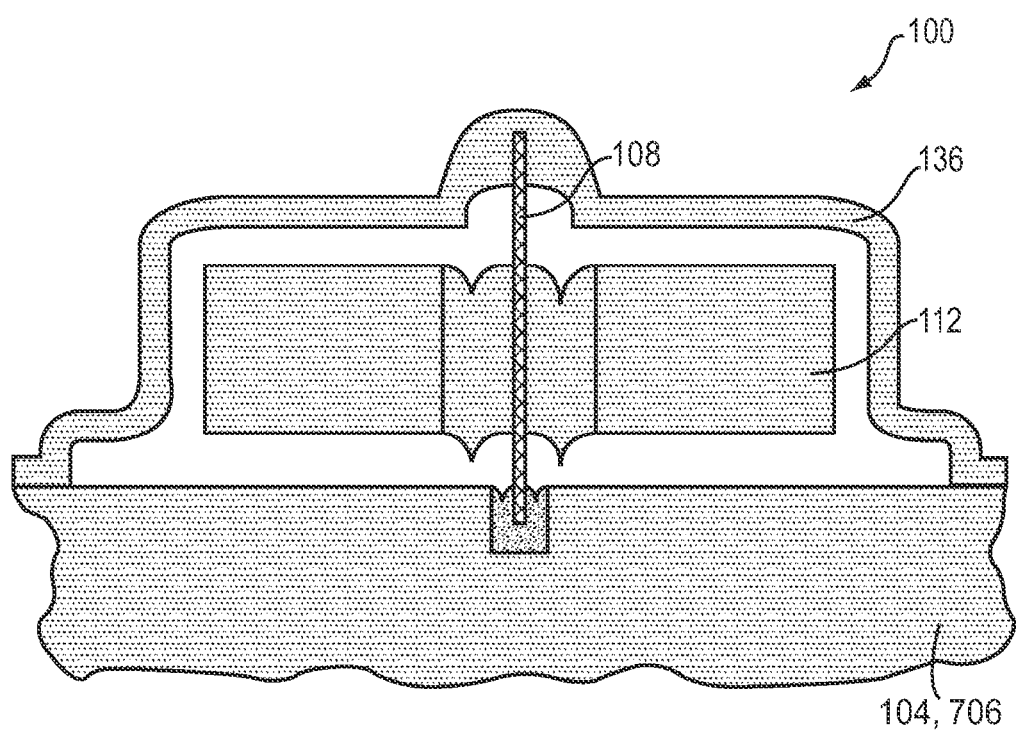
FIG. 2 schematically illustrates a rotary device according to another embodiment of the invention.

While the rotary device 100 illustrated in FIG. 1 is a singly-supported bearing (i.e., a Stodola rotor), the rotary device 100 may instead be doubly-clamped or doubly-supported as illustrated in FIG. 2. More particularly, as further described below, the second end 128 of the multiwall nanotube 108 may be coupled to an additional support structure 136.

Figure 3A:
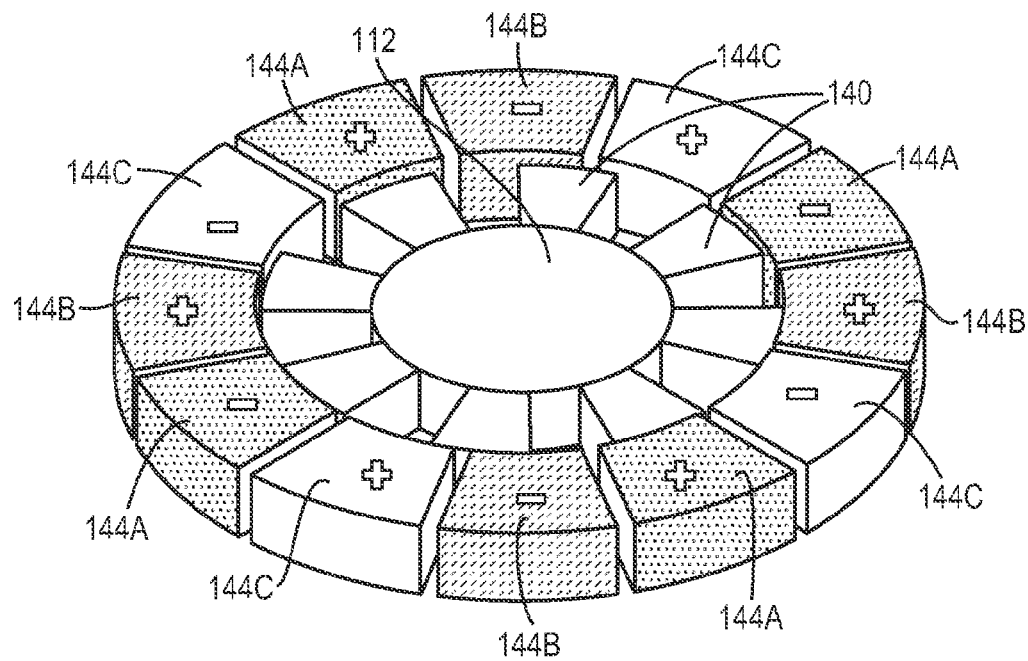
FIGS. 3A and 3B schematically illustrate an approach for electrostatically actuating a rotor in accordance with one embodiment of the invention.
Figure 3B:
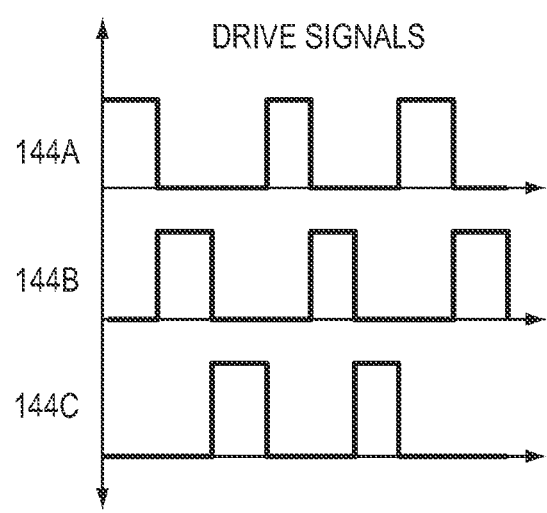

The rotary device 100 may further include means for actuating the rotor 112. The actuating means may impart rotation to the rotor 112 through a variety of techniques. For example, an electrostatic force may be employed to actuate the rotor 112. One approach to electrostatically actuating the rotor 112 is depicted in FIGS. 3A and 3B. As illustrated in FIG. 3A, the outer periphery of the rotor 112 may be patterned with a substantially circular arrangement of electrodes 140, and a substantially concentric circle of stator electrodes 144 may be fixed in position and be formed around (while still being physically separated and spaced from) the electrodes 140. Alternatively, if more desirable for a particular device geometry, the stator electrodes 144 may be positioned above (or below) the rotor electrodes 140, rather than therearound. The rotor electrodes 140 may be embedded in the rotor 112 by, for example, being electroplated in cavities formed in the rotor 112. Alternatively, the rotor electrodes 140 may be glued in place. In yet another embodiment, simply patterning the rotor 112 as illustrated in FIG. 3A, if the rotor 112 material itself (e.g., silicon) is conducting, forms the electrodes 140 without the need to add metal thereto.

As illustrated, the stator may include a first group of four electrodes 144A, a second group of four electrodes 144B, and a third group of four electrodes 144C—i.e., 12 electrodes in total. Any number of stator electrodes 144 (or groups thereof) and/or rotor electrodes 140 may, however, be employed. Actuation of the rotor 112 relies on the principle that an electric potential applied between two electrodes generates a force that tends to move the electrodes into alignment. More specifically, by alternately applying a drive signal to each group of stator electrodes 144A, 144B, and 144C in turn, as illustrated in FIG. 3B, the rotor 112 is caused to rotate as its electrodes 140 attempt to align themselves with the group of stator electrodes 144A, 144B, or 144C currently being driven. In principle, smooth rotation of the rotor 112 at a precisely controlled speed in either direction is possible with application of continuously varying periodic potentials to the stator electrodes 144A, 144B, and 144C.

Figure 3C:
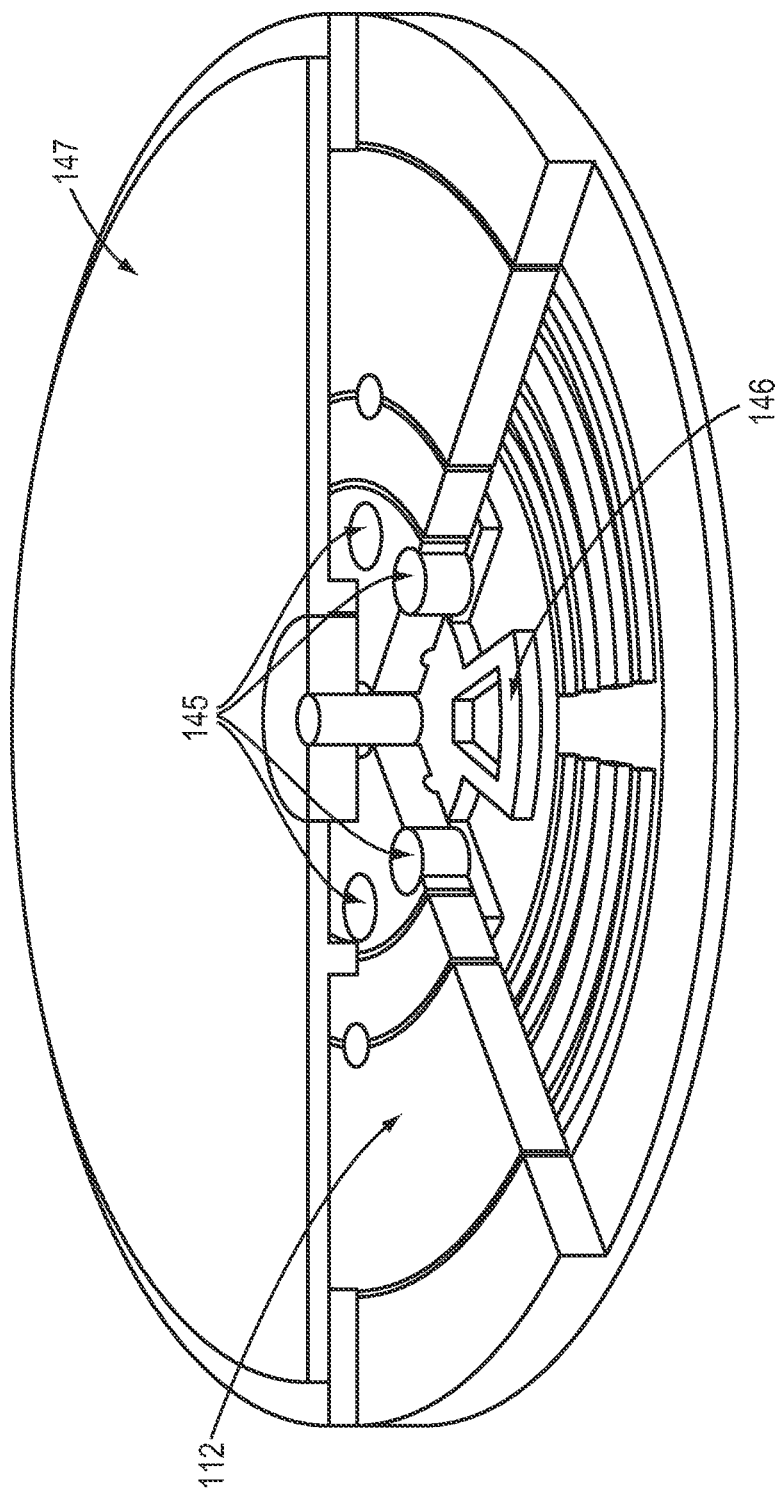
FIG. 3C schematically illustrates an approach for electromagnetically actuating a rotor in accordance with one embodiment of the invention.

Alternatively, an electromagnetic force may be employed to actuate the rotor 112. One approach to electromagnetically actuating the rotor 112 is to pattern, as illustrated in FIG. 3C, permanent magnets 145 on the rotor 112 and metal windings 146 on a stator. The permanent magnets 145 may be embedded in the rotor 112 by, for example, being electroplated in cavities formed in the rotor 112 or being glued in place. While only one metal winding 146 is visible in FIG. 3C, at least one further metal winding 146 (e.g., below the one shown or coupled to the top plate 147) is also present. Each metal winding 146 provides an alternating magnetic field in space. As will be readily understood by one of ordinary skill in the art, by properly phasing the metal windings 146, a rotating magnetic field is created. This rotating magnetic field rotates the rotor 112 by pushing against the permanent magnets 145.

Figure 4:
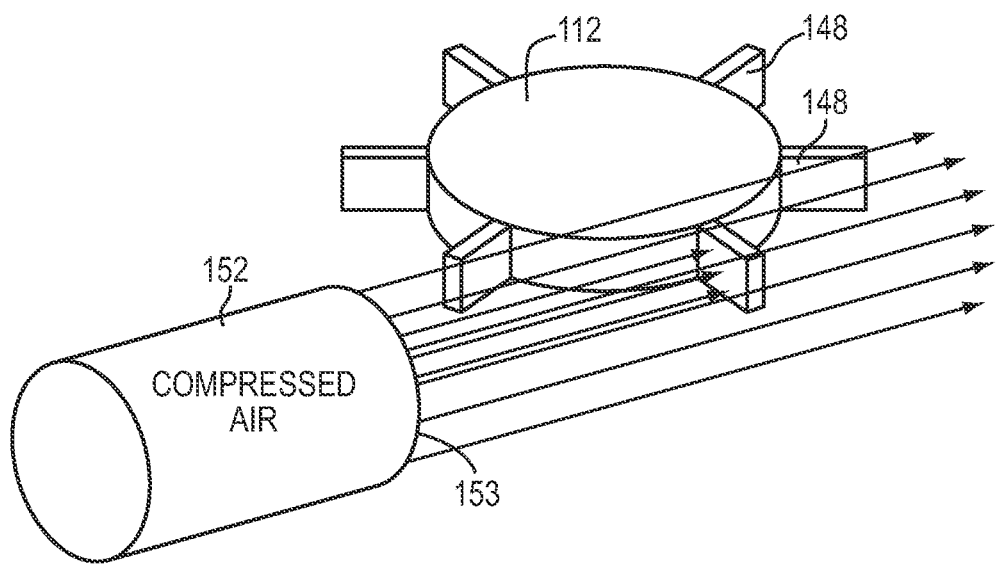
FIG. 4 schematically illustrates an approach for actuating a rotor with a jet of air in accordance with one embodiment of the invention.

Another approach to actuating the rotor 112 is depicted in FIG. 4. Here, a jet of air is employed. More specifically, in this embodiment, a set of vanes 148 is provided on the outer periphery of the rotor 112. As described further below, these vanes 148 may be integrally formed with the rotor 112 during its manufacture. Alternatively, the vanes 148 may be separately formed and bonded to the rotor 112 with, for example, an epoxy or glue. In one embodiment, the vanes 148 are each approximately 5 µm in length.

As further illustrated in FIG. 4, a means 152 for blowing air may be connected to (i.e., be in fluidic communication with) a source of compressed air, or a fan, and may also be positioned in proximity to the rotor 112 (e.g., within a few micrometers) in order to direct that air onto the rotor's vanes 148 to exert torque on, and therefore provide rotation to, the rotor 112. The means 152 for blowing the air may be, for example, a micro-sized needle or tube (such as a glass micropipette). Needles and/or tubes are available, for example, with openings down to 0.1 µm in diameter. In one embodiment, the needle/tube 152 exit 153 is positioned within approximately 5 needle/tube diameters of the rotor 112 so that the jet of air released therefrom remains focused. In addition, as illustrated, the needle/tube 152 is positioned on only one side of the rotor 112 such that the jet of air released therefrom impinges the vanes 148 on only a single side of the rotor 112. In another embodiment, two needles/tubes 152 are employed, one on each side of the rotor 112, to blow air in opposite directions. In practice, however, any number of needles/tubes 152 may be employed on either side of the rotor 112.

The force imparted on a vane 148 by the air jet, assuming it is equal to the force required to transfer the momentum from the air in the jet to the rotor 112, can be computed based on elementary fluid mechanics. Moreover, with the geometry of the rotor 112 described above and a jet diameter of 5 µm, and at room temperature and pressure, a jet velocity of about only 10 m/s will exert sufficient drag on a vane 148 in order to overcome the friction impeding the rotor's rotation.

As will be understood by one of ordinary skill in the art, fluids (e.g., gases or liquids) other than air may instead, or in addition, be employed to impart rotation to the rotor 112. For example, pure nitrogen gas may be employed. As another example, the rotary device 100 may be submerged and deionized water or isopropanol employed to impart rotation to the rotor 112. In addition, rather than employing a micro-sized needle or tube to direct the air or other fluids, an integrated fluidic channel may be fabricated in material proximate the rotor 112 during the manufacture of the rotor 112. For example, the integrated fluidic channel may be patterned and etched in material proximate the rotor 112 during the patterning and etching of the rotor 112 in the exemplary manufacturing processes described below.

Figure 5:
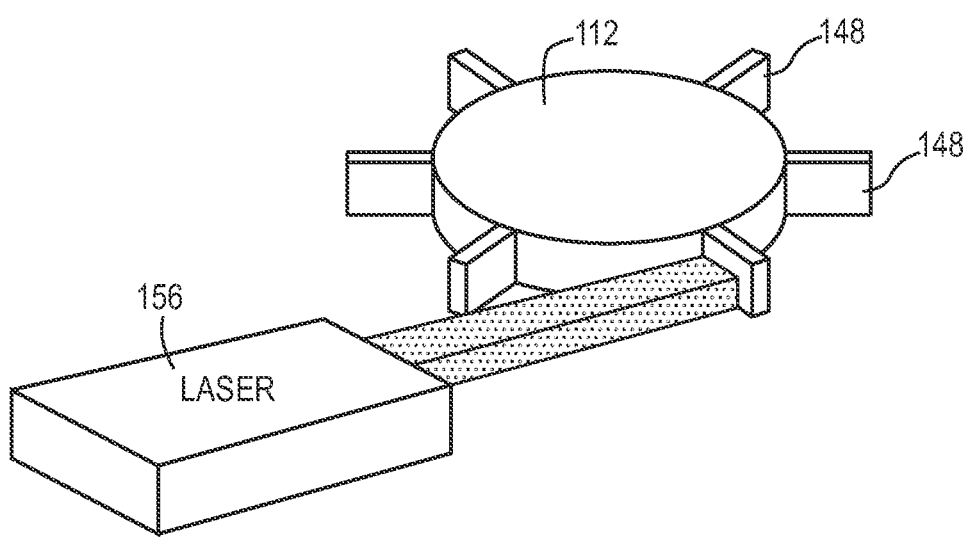
FIG. 5 schematically illustrates an approach for actuating a rotor with a beam of photons in accordance with one embodiment of the invention.

In yet another embodiment, as illustrated in FIG. 5, a beam of photons may be employed to impart rotation to the rotor 112. More particularly, a laser 156 (e.g., a milliwatt laser) may be positioned in proximity to a rotor 112 having the vanes 148 located around its periphery. In such a case, the pressure of the radiation emitted by the laser 156 provides sufficient torque to actuate the rotor 112. In particular, photons incident on a vane 148 create a torque on, and transfer momentum to, the rotor 112.

Unless the reflectivity of the vane 148 surface is very high, most of the power from the laser 156 is absorbed by (i.e., delivered as heat to) the vane 148. The pressure exerted by the laser 156 on a vane 148 of perfectly absorbing material is given as the power of the laser 156 divided by the product of the laser beam's cross-sectional area and the speed of light. Therefore, if the laser beam can be focused to be entirely incident on the vane 148, the force exerted on the vane 148 is the power of the laser 156 over the speed of light. For a vane 148 having a perfectly reflecting surface (e.g., a mirror thereon), this force is doubled, since the photon's momentum must be completely reversed, rather than absorbed. In one embodiment, assuming silicon reflects 40% of incoming light, approximately 600 mW of laser 156 power is required to overcome the friction impeding the rotation of a rotor 112 having the geometry described above.

Alternatively, an ion beam generator (e.g., an ion gun in a vacuum) may be used in place of the laser 156 depicted in FIG. 5. As ions are not absorbed like photons, this eliminates the heat dissipation concern that arises when employing the laser 156. Additionally, each ion provides substantially more momentum than a photon, so fewer ions are required to generate the requisite torque for imparting rotation to the rotor 112.

Yet another option is to employ a manipulator, such as the sub-micrometer resolution manipulators used to probe microelectronic devices, to physically push on the rotor 112.

Figure 6:
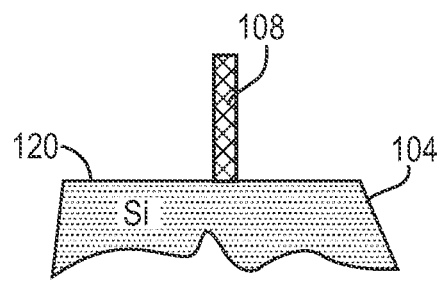
FIGS. 6A-6E schematically illustrate the steps in one embodiment of a method for fabricating the rotary device depicted in FIG. 1.
Figure 6:
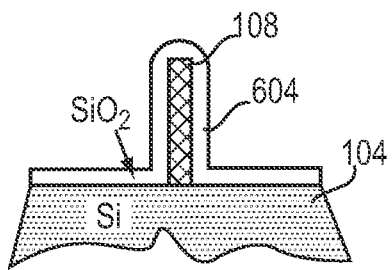
Figure 6:
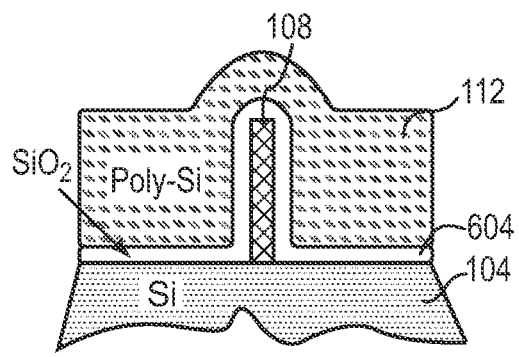
Figure 6:
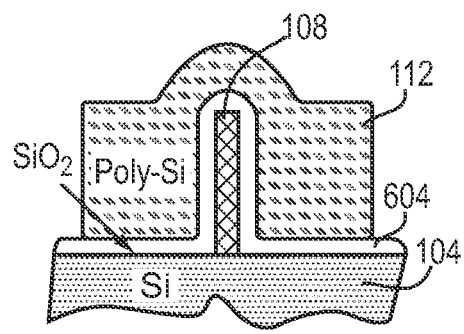
Figure 6:
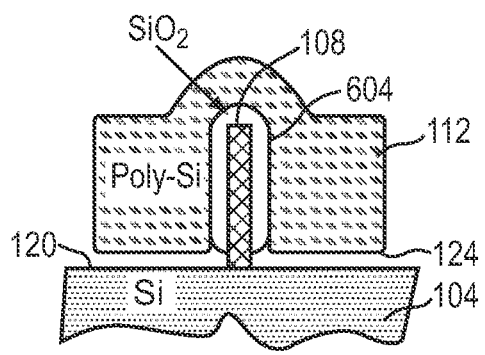

FIGS. 6A-6E schematically illustrate the steps in one embodiment of a method for fabricating the rotary device 100 depicted in FIG. 1. First, as illustrated in FIG. 6A, a multiwall nanotube 108 is provided on a top surface 120 of a substrate 104 (e.g., a silicon substrate 104) by one of a variety of optional techniques. For example, the multiwall nanotube 108 may be grown on the substrate 104 by PECVD on patterned catalyst particles (e.g., nickel, cobalt, or iron). According to one exemplary technique, a thin film of nickel is patterned on a p-type boron-doped 9.5 Ω-cm silicon substrate 104. Then, an electron-beam resist is patterned by electron beam lithography and development to open a small window for nickel nanodot deposition. A thin nickel layer of approximately 10 nm to 100 nm in thickness is then deposited by electron-beam or thermal evaporation. The final nickel pattern remains after resist/film liftoff in acetone or other solvent. The patterned substrate 104 is then loaded into a PECVD system, for example with a base pressure below $10^{-6}$ torr. In one exemplary embodiment, the multiwall carbon nanotube 108 is then grown at a pressure of 1 to 10 torr with a gas mixture of acetylene and ammonia at a ratio of 40:160. The growth time is about 5 minutes at a temperature below 600° C. Alternatively, hydrocarbon gases other than acetylene may be employed, such as ethylene or methane. In one embodiment, the nickel catalyst decomposes the mixture gas to produce carbon and a byproduct. The carbon dissolves into the nickel catalyst and precipitates out from its circumference as the multiwall carbon nanotube 108. Thus, the nickel acts as a template from which the multiwall carbon nanotube 108 is formed. By controlling the catalyst size and reaction time one can easily tailor the multiwall nanotube 108 diameter and length, respectively, to suit the particular application of interest.

After the multiwall nanotube 108 is grown, additional steps may be taken to further reduce defect density in the nanotube 108. For example, local annealing techniques may be employed. Passing electrical current through the nanotube 108 may be used to cause sufficient joule heating for local annealing and improvement of graphitization in the nanotube 108. In addition, if catalyst material remains, it may further improve the effect of annealing the nanotube 108 by encouraging diffusion of defects. Further details on this and other multiwall carbon nanotube growth processes are well-characterized in the art and may be found in, for example: i) J. G. Wen et al. "Growth and characterization of aligned carbon nanotubes from patterned nickel nanodots and uniform thin films," J. Mater. Res., Vol. 16, No. 11, 3246-3253, November 2001; ii) K. Jensen et al. "Current-controlled nanotube growth and zone refinement," Applied Physics Letters, Vol. 86, No. 17, 2005; and iii) U.S. Patent Application Publication No. 2006/0231381 entitled "Growth of and Defect Reduction in Nanoscale Materials," the contents of which are hereby incorporated herein by reference in their entirety.

Alternatively, the multiwall nanotube 108 may first be produced by electric arc discharge or laser ablation and then spot-welded or tack-welded (using electrical current, for example) onto the substrate 104 using an appropriate nanomanipulator. More specifically, as will be understood by one of ordinary skill in the art, the electric arc discharge technique involves the generation of an electric arc between two graphite electrodes, one of which is usually filled with a catalyst metal powder (e.g., nickel, cobalt, or iron), in a Helium atmosphere. The laser ablation technique typically uses a laser to evaporate a graphite target that is usually also filled with a catalyst metal powder. The electric arc discharge and laser ablation techniques tend to produce an ensemble of carbonaceous material that contains nanotubes (30-70%), amorphous carbon, and carbon particles (usually closed-caged ones). A single nanotube may then be extracted by an appropriate purification process before being manipulated (e.g., spot-welded or tack-welded) into place on the substrate 104.

Once the multiwall nanotube 108 has been provided on the substrate 104, a conformal release layer 604 (e.g., $SiO_2$) may be grown on the substrate 104 and around the multiwall nanotube 108, as illustrated in FIG. 6B. For example, the conformal release layer 604 may be deposited by PECVD oxide deposition or, alternatively, by any other appropriate oxide deposition process, including, for example, CVD/low temperature oxide ("LTO") oxide deposition, dry oxidation, wet oxidation, or a spin-on technique (e.g., spin-on glass). The rotor material 112 (e.g., polysilicon) may then be deposited (e.g., by thermal CVD) on the release layer 604 and around the nanotube 108, as illustrated in FIG. 6C. Following that, the rotor material 112 may be patterned (e.g., with electron-beam or other nanolithography techniques) and etched (e.g., with reactive ion etching) so as to shape the rotor 112, as illustrated in FIG. 6D. Similarly, means for actuating the rotor 112 (e.g., drive electrodes 140, permanent magnets 145, vanes 148, etc.) may be patterned (e.g., with electron-beam or other nanolithography techniques) and etched (e.g., with reactive ion etching) on the rotor material 112. Then, at least a portion of the release layer 604 between the top surface 120 of the substrate 104 and the bottom surface 124 of the rotor 112 may be removed (e.g., by etching the release layer with vapor hydrofluoric acid) so as to space the rotor 112 from the substrate 104, as illustrated in FIG. 6E. Finally, the bottom portions of one or more outer walls of the multiwall nanotube 108 (e.g., the portions located between the top surface 120 of the substrate 104 and the bottom surface 124 of the rotor 112) may be removed so as to facilitate rotation of the rotor 112 about the elongate axis of the multiwall nanotube 108. For example, those portions may be mechanically sheared away by applying torque to the rotary device 100 until the portions fail or break from the resulting stress. Alternatively, those portions may be removed using electrical breakdown by, for example, passing current through the multiwall nanotube 108 to vaporize the outer nanotube shells. In either case, the bottom portions of one or more inner walls of the multiwall nanotube 108 (e.g., the portions located between the top surface 120 of the substrate 104 and the bottom surface 124 of the rotor 112) remain intact to serve as the bearing.

Figure 7A:
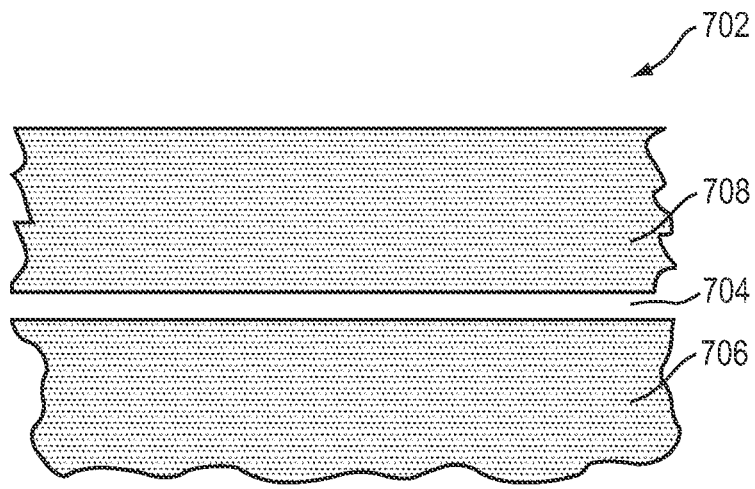
FIGS. 7A-7Z schematically illustrate the steps in one embodiment of a method for fabricating the rotary device depicted in FIG. 2.
Figure 7B:
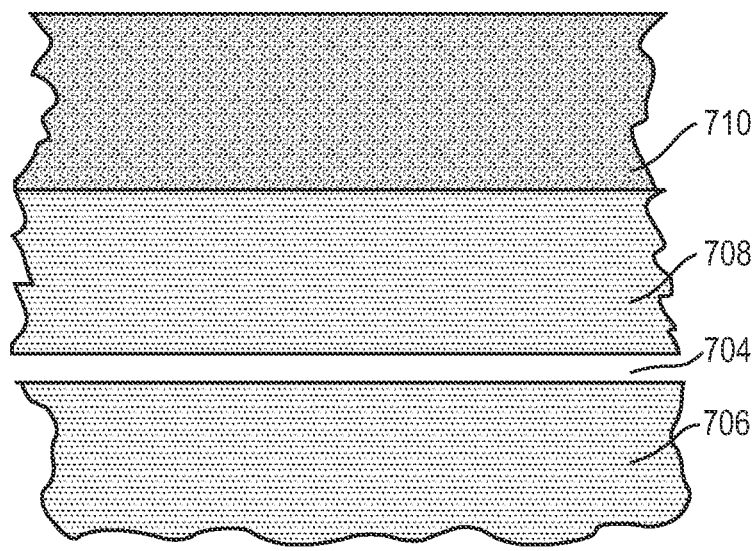
Figure 7C:
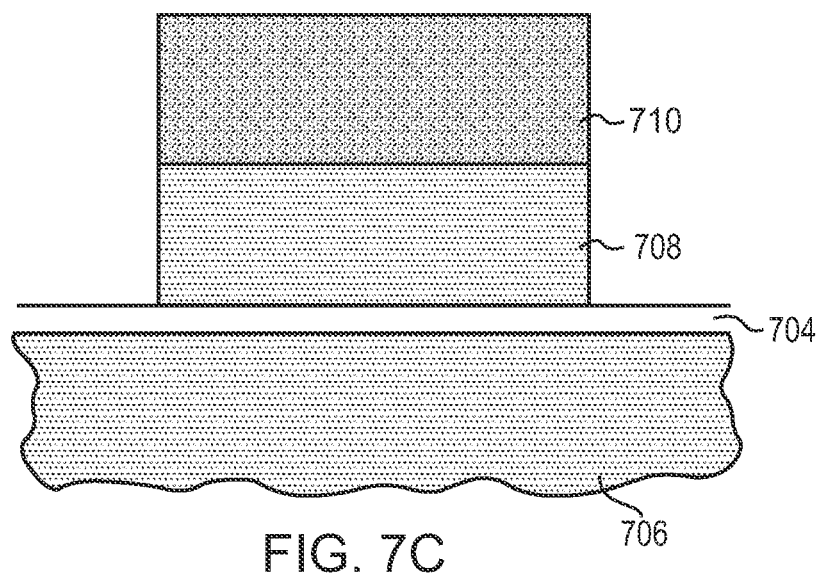
Figure 7D:
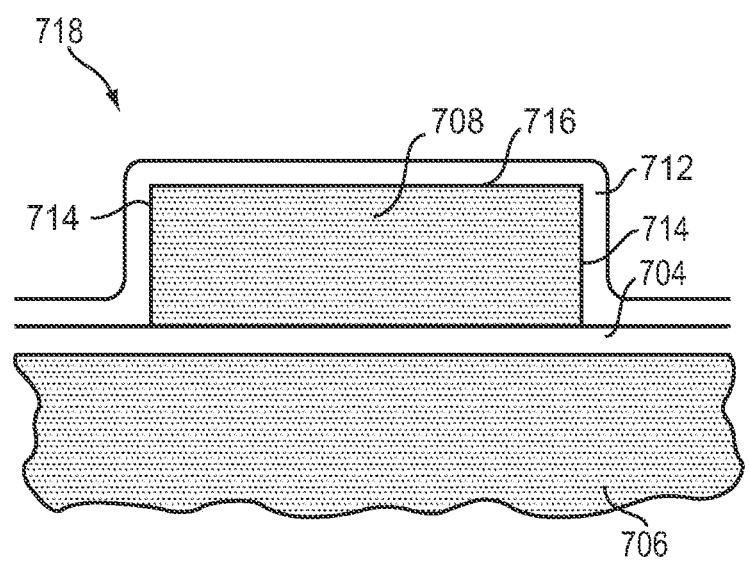
Figure 7E:
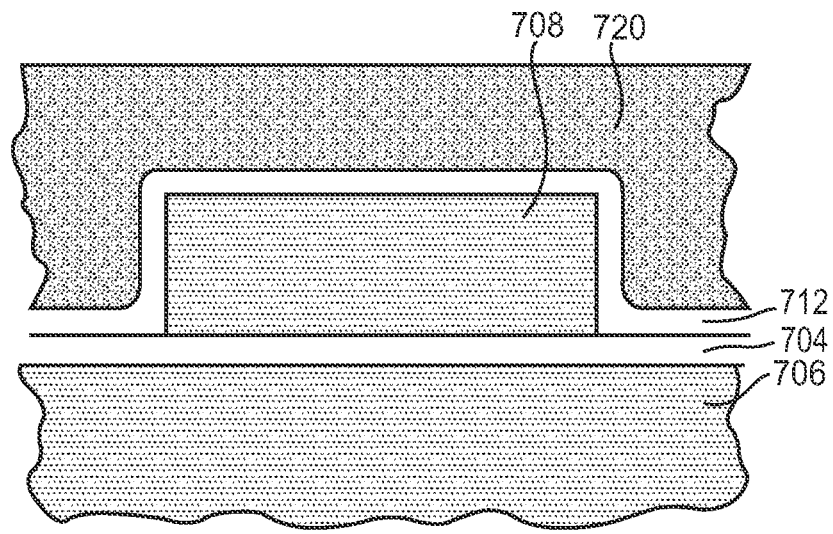
Figure 7F:
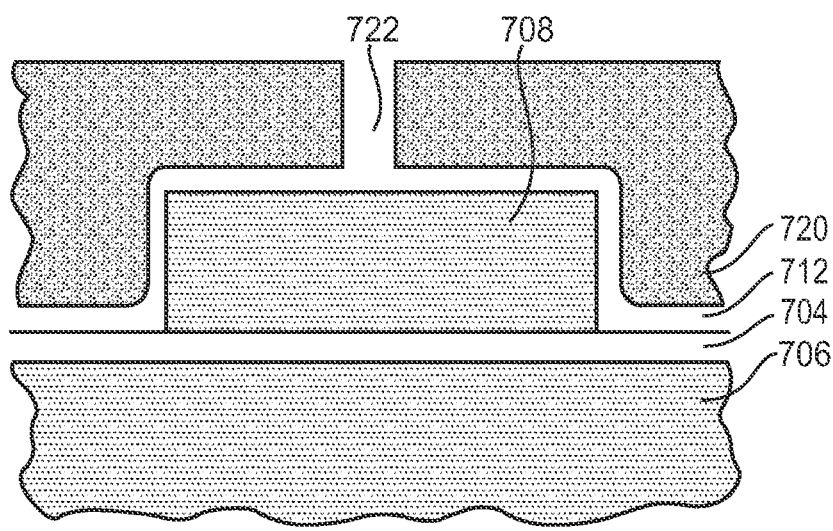
Figure 7G:
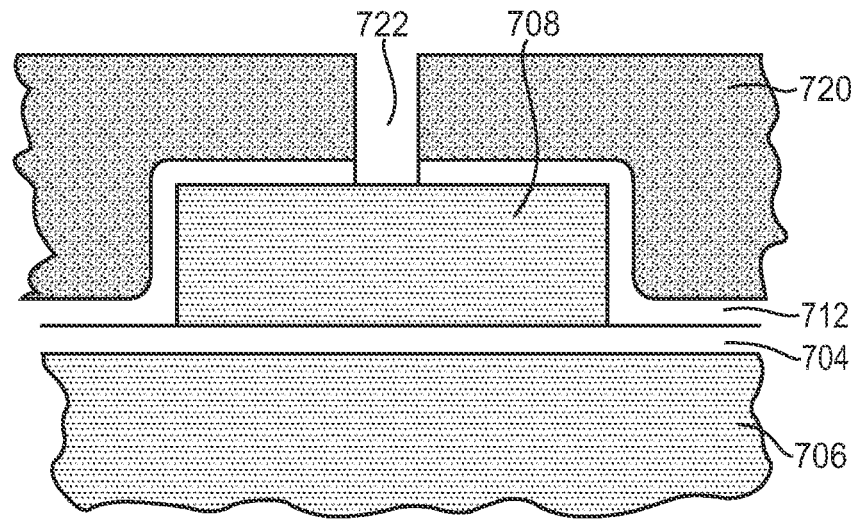
Figure 7H:
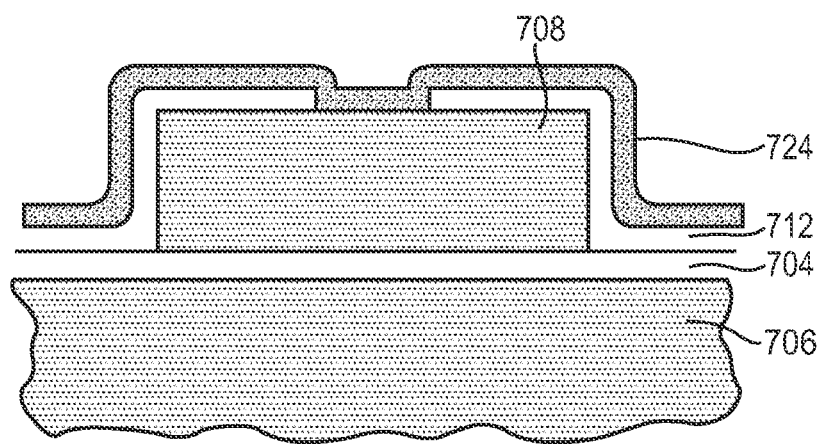
Figure 7I:
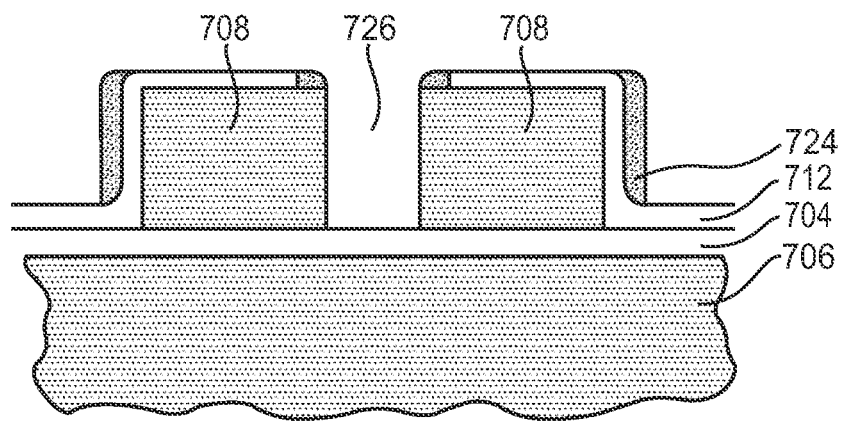
Figure 7J:
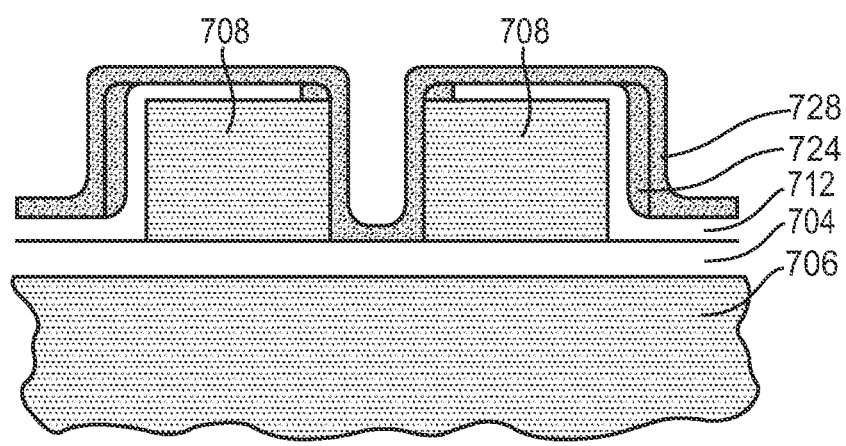
Figure 7K:
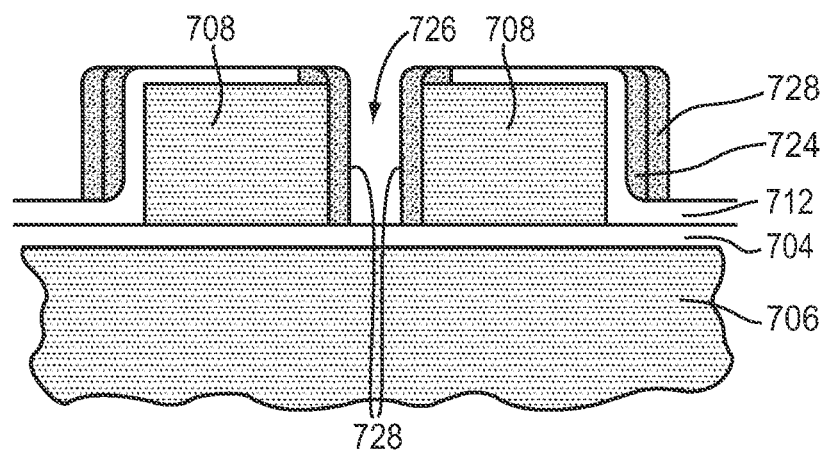
Figure 7L:
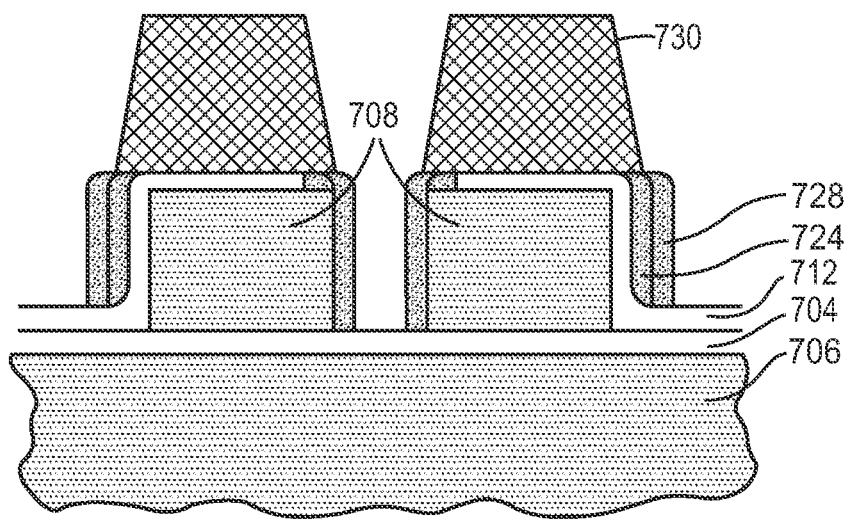
Figure 7M:
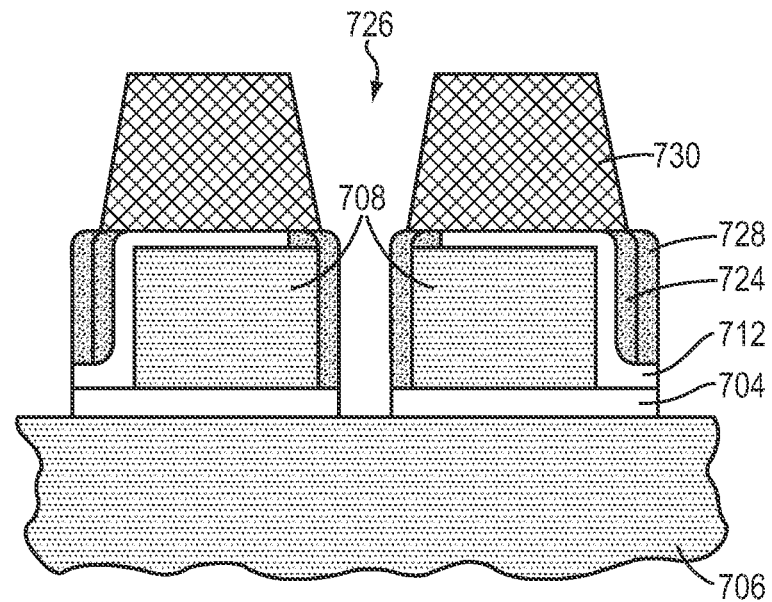
Figure 7N:
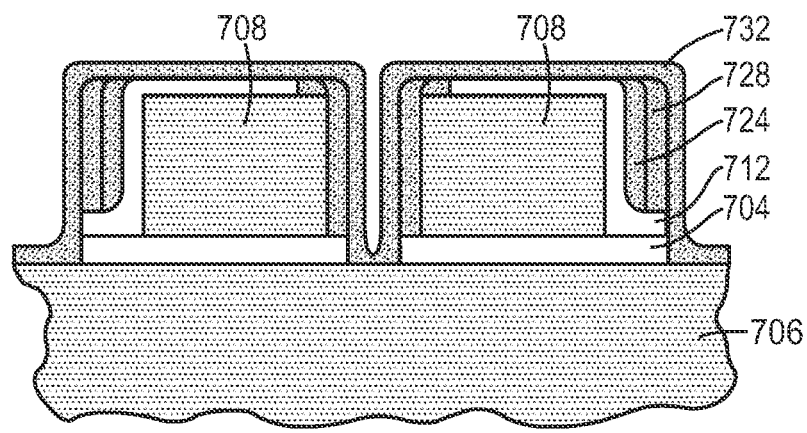
Figure 7O:
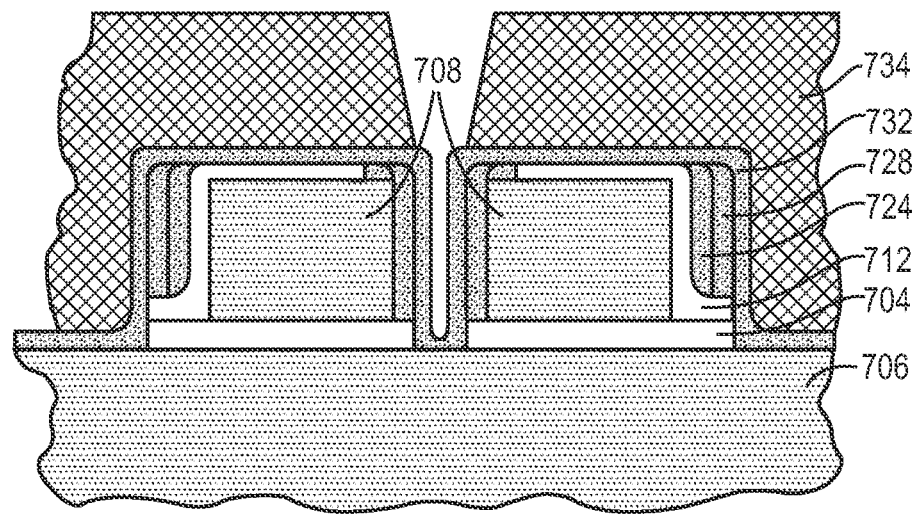
Figure 7P:
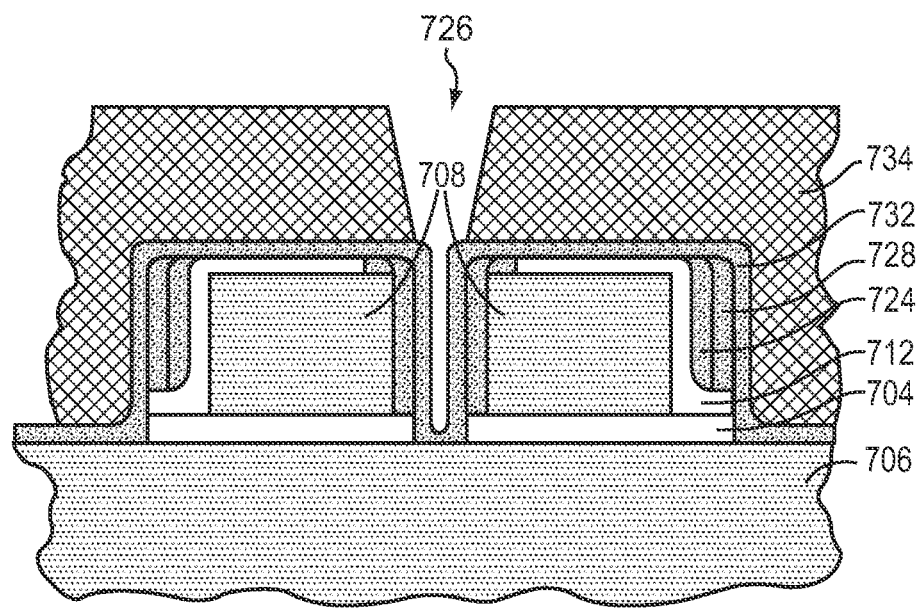
Figure 7Q:
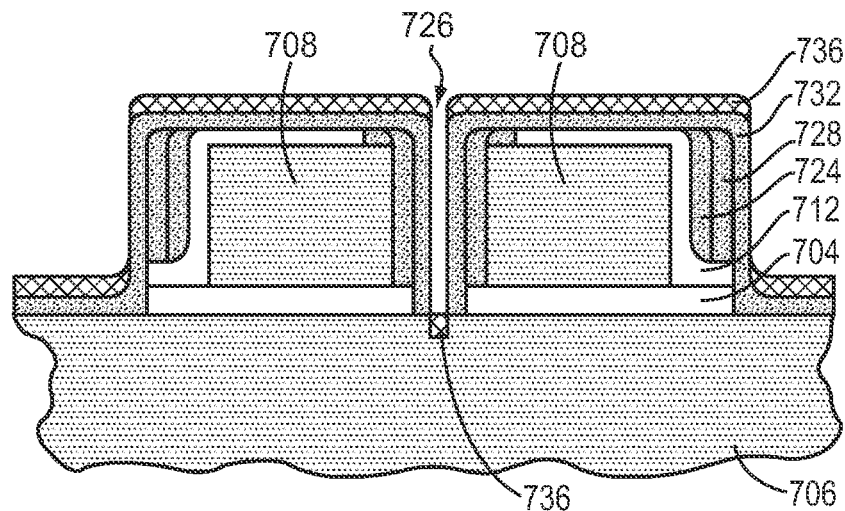
Figure 7R:
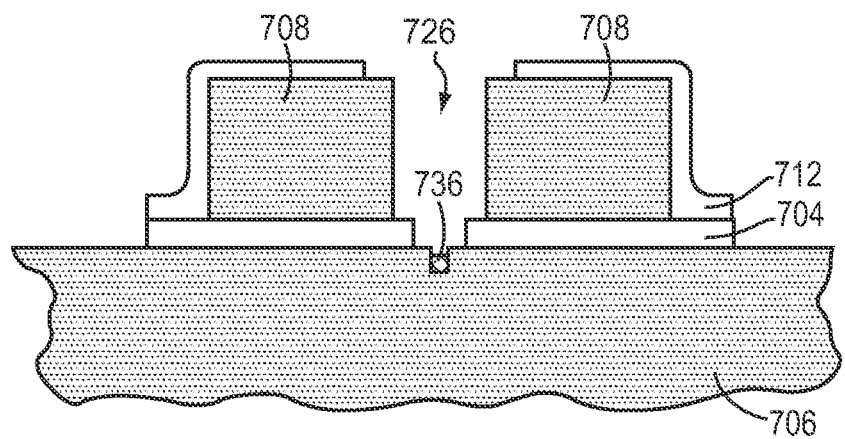
Figure 7S:
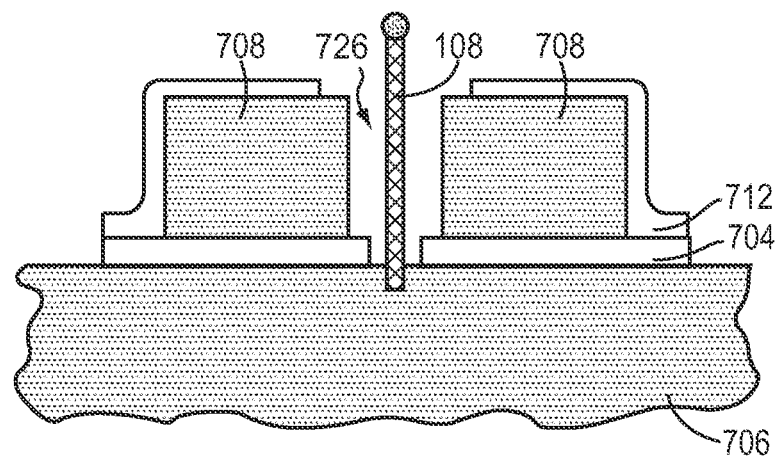
Figure 7T:
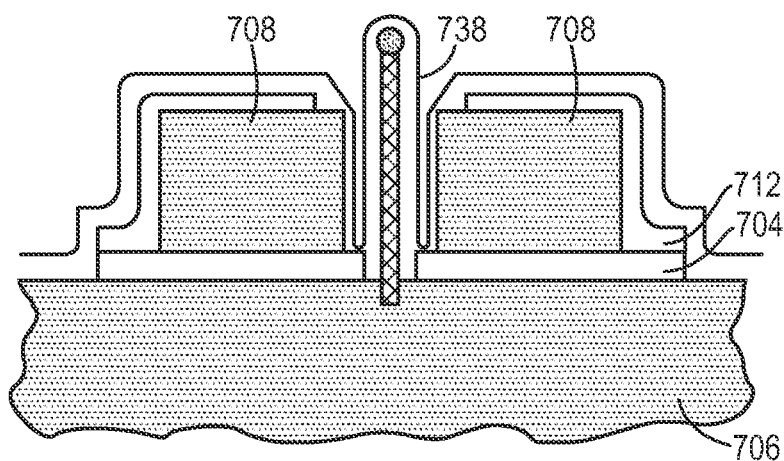
Figure 7U:
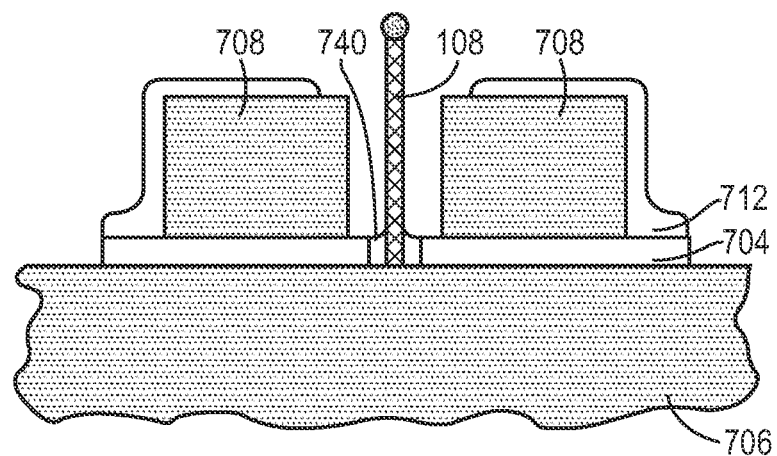
Figure 7V:
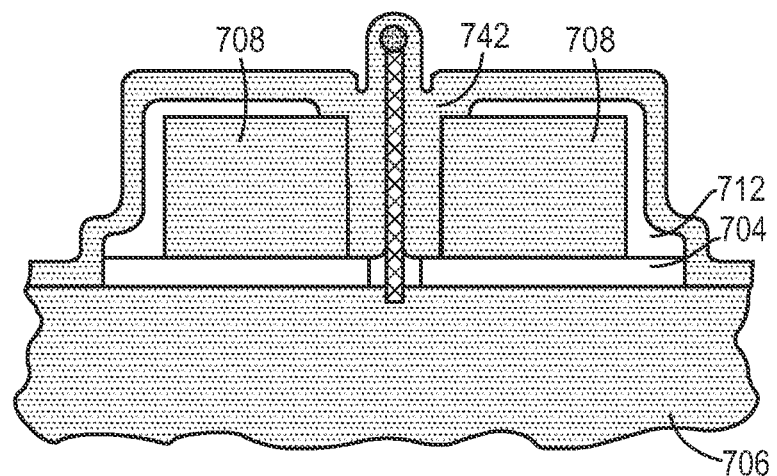
Figure 7W:
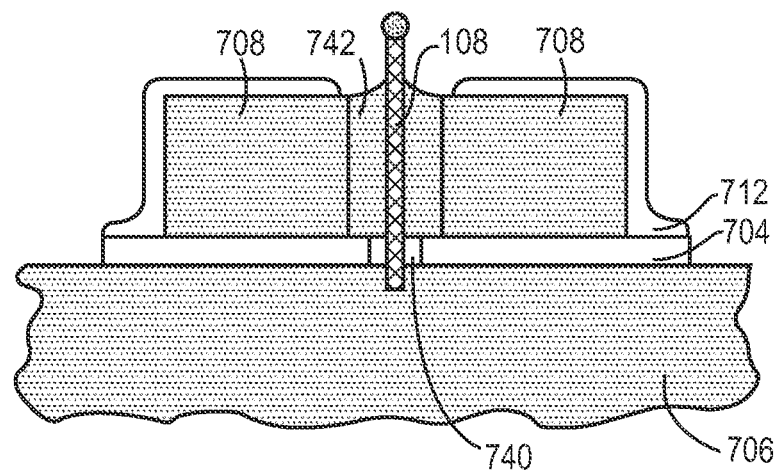
Figure 7X:
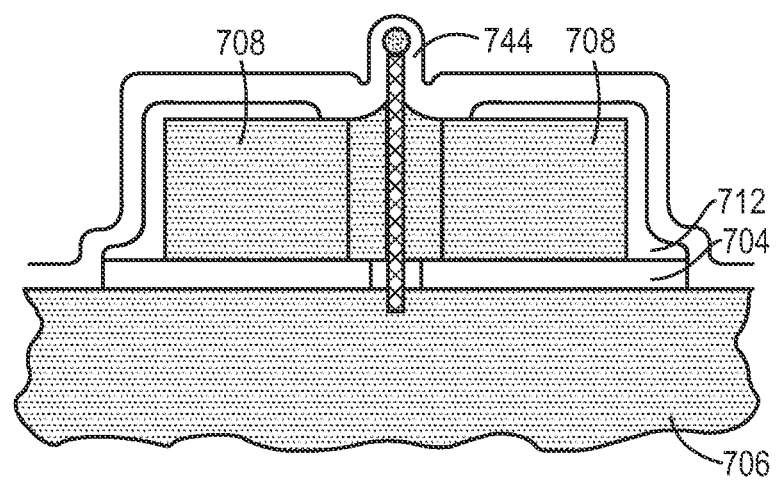
Figure 7Y:
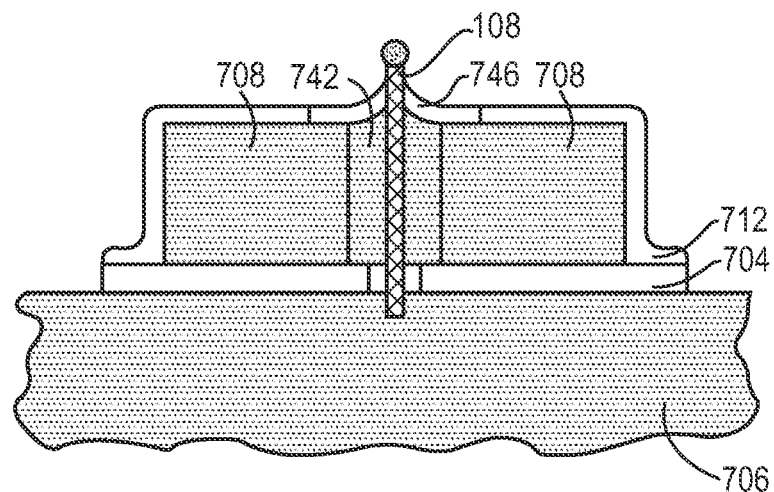
Figure 7Z:
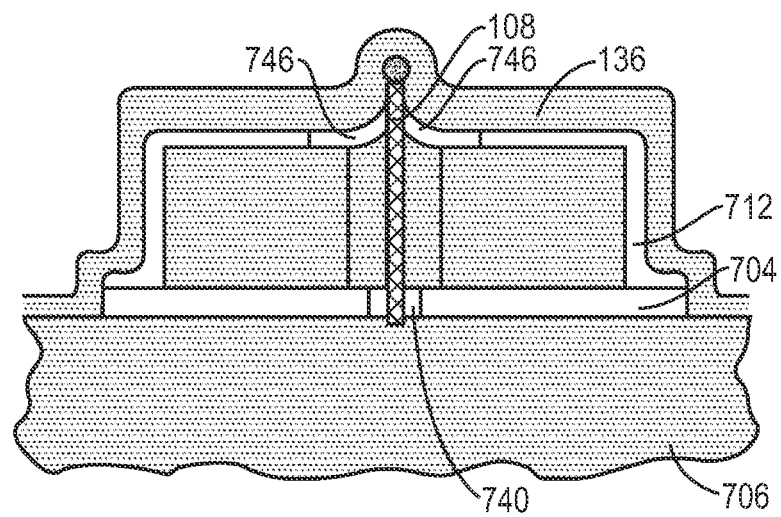

FIGS. 7A-7Z schematically illustrate the steps in one embodiment of a method for fabricating the doubly-clamped, or doubly-supported, rotary device 100 depicted in FIG. 2. As illustrated in FIG. 7A, the process either begins by providing a silicon on insulator ("SOI") wafer 702 or the SOI wafer 702 is constructed. In one embodiment, to construct the SOI wafer 702, an initial sacrificial oxide layer 704 (e.g., silicon dioxide) is deposited on a standard silicon wafer 706. The initial sacrificial oxide layer 704 may be deposited by PECVD oxide deposition or, alternatively, by any other appropriate oxide deposition process, including, for example, CVD/LTO oxide deposition, dry oxidation, wet oxidation, or a spin-on technique (e.g., spin-on glass). Then, a rotor silicon layer 708 may be deposited on the initial sacrificial oxide layer 704. For example, a polycrystalline silicon layer 708 may be deposited by thermal CVD or a poly- or amorphous silicon layer 708 may be deposited by PECVD. Alternatively, another separate silicon wafer 708 may be bonded to the initial sacrificial oxide layer 704.

As illustrated in FIG. 7B, photoresist 710 may then be applied to the rotor silicon layer 708. For example, the photoresist 710 may be spun on, with associated bakes. The stacked structure depicted in FIG. 7B may then be exposed and developed, and the rotor silicon layer 708 etched to form the structure depicted in FIG. 7C. More particularly, the photoresist 710 may be exposed with a contact aligner by ultraviolet ("UV") light, or exposed with a stepper or an electron-beam tool. Then, the rotor silicon layer 708 may be anisotropically etched by an etching process that is selective for silicon as opposed to photoresist. For example, a fluorine based anisotropic plasma etch (e.g., employing $SF_6/O_2$), another fluorine based plasma etch, a deep reactive-ion etching ("DRIE") cyclic plasma etch, a chlorine based plasma etch, or a KOH liquid etch may be employed.

The photoresist 710 may then be removed and a second sacrificial oxide layer 712 (e.g., silicon dioxide) conformally applied to the rotor silicon layer 708 so as to form the oxidized silicon-insulator-silicon layered substrate 718 depicted in FIG. 7D. The photoresist 710 may be removed by, for example, an acetone or other solvent, oxygen plasma, or a piranha cleaning solution. In one embodiment, the application of the second sacrificial oxide layer 712 is conformal, coating both the sidewalls 714 and the top surface 716 of the rotor silicon layer 708 to allow for a subsequent easy release thereof, as explained further below. As before, the second sacrificial oxide layer 712 may be applied by PECVD oxide deposition, CVD/LTO oxide deposition, dry oxidation, wet oxidation, or any other appropriate conformal oxide deposition process.

As illustrated in FIG. 7E, photoresist 720 may then be applied (e.g., spun on, with associated bakes) to the oxidized silicon-insulator-silicon layered substrate 718 and, as illustrated in FIG. 7F, be exposed and developed so as to form a well 722 therein. Again, the photoresist 720 may be exposed with a contact aligner by UV light, or exposed with a stepper or an electron-beam tool.

Turning to FIG. 7G, the portion of the second sacrificial oxide layer 712 exposed by the well 722 in the photoresist 720 may then be removed by etching or another process. For example, it may be removed by a fluorine based anisotropic plasma etch (e.g., employing $CHF_3/O_2$), another fluorine based plasma etch, a chlorine based plasma etch, a liquid HF acid etch (buffered or unbuffered), or a HF vapor etch.

The photoresist 720 may then be removed (e.g., by an acetone or other solvent, an oxygen plasma, or a piranha cleaning solution) from the oxidized silicon-insulator-silicon layered substrate 718 and a conformal isotropic nitride layer 724 deposited thereon, as illustrated in FIG. 7H. In various embodiments, the conformal nitride layer 724 is deposited by PECVD, thermal CVD, or sputtering.

The conformal nitride layer 724 may then be anisotropically etched by an etching process that is selective for nitride as opposed to silicon dioxide and silicon, and, following that, the rotor silicon layer 708 anisotropically etched by an etching process that is selective for silicon as opposed to $SiN_x$ and silicon dioxide. In this way, as illustrated in FIG. 7I, a well 726 is formed through the rotor silicon layer 708. As will become more evident below, the anisotropic etch of the conformal nitride layer 724 (and further conformal nitride layers described below) progressively leaves remnants of the conformal nitride layers as sidewalls in the well 726 and eventually (once the nitride sidewalls are stripped, as detailed below) leads to a stair-stepped configuration for the well 726. For example, as can already be seen by comparing FIG. 7I to FIG. 7G, the width of the well 726 etched into the rotor silicon layer 708 is less than the width of the well 722 etched into the second sacrificial oxide layer 712.

The etch of the nitride layer 724 may be, for example, a fluorine based anisotropic plasma etch (e.g., employing $CHF_3/O_2$), another fluorine based plasma etch, or a chlorine based anisotropic plasma etch, while the etch of the rotor silicon layer 708 may be, for example, a fluorine based anisotropic plasma etch (e.g., employing $SF_6/O_2$), another fluorine based plasma etch, a DRIE cyclic plasma etch, a chlorine based plasma etch, or a KOH liquid etch.

As illustrated in FIG. 7J, a second conformal isotropic nitride layer 728 may then be deposited (e.g., by PECVD nitride deposition, thermal CVD nitride deposition, or sputtering) and, following that, anisotropically etched as illustrated in FIG. 7K by an etching process that is selective for nitride as opposed to silicon dioxide. For example, a fluorine based anisotropic plasma etch (e.g., employing $CHF_3/O_2$), another fluorine based plasma etch, or a chlorine based anisotropic plasma etch may be employed. Again, the anisotropic etch of the second conformal nitride layer 728 leaves sidewalls of the nitride layer 728 in the well 726, which, as will be seen, leads to a stair-stepped configuration for the well 726.

Photoresist 730 may then be applied (e.g., in a fashion similar to those previously described) and exposed and developed (e.g., using any of the exemplary processes described above) to form the substantially annular pattern of photoresist 730 depicted in FIG. 7L. As illustrated in FIG. 7M, the portions of the initial sacrificial oxide layer 704 and the second sacrificial oxide layer 712 that are not covered by the photoresist 730 may then be etched by an etching process that is selective for oxide as opposed to $SiN_x$ and photoresist. For example, a fluorine based anisotropic plasma etch (e.g., employing $CHF_3/O_2$), another fluorine based plasma etch, a chlorine based plasma etch, a liquid (e.g., buffered) HF acid etch, or a HF vapor etch may be employed. In this way, the well 726 through the second sacrificial oxide layer 712 and the rotor silicon layer 708 is also extended through the initial sacrificial oxide layer 704.

The photoresist 730 may then be removed, for example by using any of the appropriate solvents, plasmas, and solutions described above, and, as illustrated in FIG. 7N, a third conformal isotropic nitride layer 732 may then be deposited (e.g., by PECVD nitride deposition, thermal CVD nitride deposition, or sputtering). Photoresist 734 may then be applied (e.g., in a fashion similar to those previously described) and exposed and developed (e.g., using any of the exemplary processes described above) to form the pattern of photoresist 734 depicted in FIG. 7O. As illustrated in FIG. 7P, the portion of the third conformal isotropic nitride layer 732 that is not covered by the photoresist 734 may then be anisotropically etched by an etching process that is selective for $SiN_x$ as opposed to silicon and photoresist. For example, a fluorine based anisotropic plasma etch (e.g., employing $CHF_3/O_2$), another fluorine based plasma etch, or a chlorine based anisotropic plasma etch may be employed.

The photoresist 734 may then be removed using, for example, any of the appropriate solvents, plasmas, and solutions described above, and, following that, the silicon wafer 706 anisotropically etched by an etching process that is selective for silicon as opposed to $SiN_x$. In this way, as illustrated in FIG. 7Q, the well 726 formed through the second sacrificial oxide layer 712, the rotor silicon layer 708, and the initial sacrificial oxide layer 704 is also extended into the silicon wafer 706. The etch of silicon wafer 706 may be, for example, a fluorine based anisotropic plasma etch (e.g., employing $SF_6/O_2$), another fluorine based plasma etch, a DRIE cyclic plasma etch, a chlorine based plasma etch, or a KOH liquid etch.

In order to grow the multiwall nanotube 108 in the well 726, a catalyst 736 (e.g., nickel, iron, or cobalt) for growing the nanotube 108 may then be non-conformally deposited (e.g., through an evaporation or collimated sputtering process), as also illustrated in FIG. 7Q. The remaining nitride (i.e., the first, second, and third conformal isotropic nitride layers 724, 728, and 732) may then be stripped, as illustrated in FIG. 7R, by a process that is selective for $SiN_x$ as opposed to silicon and silicon dioxide. For example, a hot phosphoric acid may be applied. In this way, the catalyst 736 for growing the nanotube 108 is left at the bottom of the well 726, which now clearly exhibits (in FIG. 7R) a stair-stepped configuration.

The multiwall nanotube 108 may then be provided in the well 726. As described above with reference to FIG. 6A, the multiwall nanotube 108 may be grown in the well 726 by PECVD on patterned catalyst particles (e.g., nickel, cobalt, or iron). A methane gas, an acetylene gas, or another hydrocarbon gas may be employed for this purpose. Alternatively, the multiwall nanotube 108 may be grown in the well 726 by thermal CVD on patterned catalyst particles. In yet another embodiment, a multiwall nanotube 108 produced by electric arc discharge or laser ablation, as described above with reference to FIG. 6A, is spot-welded or tack-welded onto the silicon wafer 706 at the bottom of the well 726 using an appropriate nanomanipulator.

Once the multiwall nanotube 108 has been provided in the well 726, a further oxide layer 738 (e.g., a silicon dioxide layer 738) may be conformally applied to the structure, as illustrated in FIG. 7T, by any appropriate oxide deposition process, including, for example, PECVD oxide deposition or CVD/LTO oxide deposition, or other conformal deposition technique. The further oxide layer 738 may then be isotropically etched with precise timing so as to leave, as illustrated in FIG. 7U, a first release region 740 of oxide (e.g., silicon dioxide) around a first portion of the multiwall nanotube 108. Exemplary etching processes that are selective for silicon dioxide as opposed to silicon and the carbon of the multiwall nanotube 108, and that may be employed, include a HF acid vapor etch, a liquid HF acid etch, a buffered HF acid etch, and a fluorine based plasma etch. As illustrated, the first release region 740 left over by this process may be substantially co-planar with (i.e., lie in substantially the same layer as) the initial sacrificial oxide layer 704.

As illustrated in FIG. 7V, further rotor material 742 may then be conformally deposited on the structure. For example, polycrystalline silicon may be deposited by thermal CVD or poly- or amorphous silicon may be deposited by PECVD. The further rotor material 742 may then be isotropically etched with precise timing so as to leave, as illustrated in FIG. 7W, the further rotor material 742 over the first release region 740 and around a second portion of the multiwall nanotube 108. Exemplary etching processes that are selective for silicon as opposed to silicon dioxide and the carbon of the multiwall nanotube 108, and that may be employed, include a $XeF_2$ vapor etch, a KOH liquid etch, and a fluorine or chlorine based plasma etch. As illustrated, the further rotor material 742 left over by this process may be substantially co-planar with (i.e., lie in substantially the same layer as) the rotor silicon layer 708.

Following application of the further rotor material 742, yet another oxide layer 744 (e.g., a silicon dioxide layer 744) may be conformally applied to the structure, as illustrated in FIG. 7X, by any appropriate oxide deposition process, including, for example, PECVD oxide deposition or CVD/LTO oxide deposition. The additional oxide layer 744 may then be isotropically etched with precise timing so as to leave, as illustrated in FIG. 7Y, a second release region 746 of oxide (e.g., silicon dioxide) over the further rotor material 742 and around a third portion of the multiwall nanotube 108. Exemplary etching processes that are selective for silicon dioxide as opposed to silicon and the carbon of the multiwall nanotube 108, and that may be employed, include, as before, a HF acid vapor etch, a liquid HF acid etch, a buffered HF acid etch, and a fluorine based plasma etch. As illustrated, the second release region 746 left over by this process may be substantially co-planar with (i.e., lie in substantially the same layer as) the second sacrificial oxide layer 712.

Next, as illustrated in FIG. 7Z, a support layer (i.e., the support structure 136 depicted in FIG. 2) may be conformally deposited on the device. For example, polycrystalline silicon may be deposited by thermal CVD or poly- or amorphous silicon may be deposited by PECVD. As depicted in FIG. 7Z, the support structure 136 is deposited over the second release region 746 and around a fourth portion of the multiwall nanotube 108. Portions of the top and/or sidewalls of the support structure 136 may be etched after masking with photo- or electron-beam resist, as described above, to provide access to the sacrificial layers 704, 712 and release regions 740, 746 for etching (as described next), and possibly to provide access to the rotor 112 (e.g., to actuate the rotor 112 with a beam of photons or ions, or with a jet of air, gas, or liquid).

To release the rotary device 100 (see FIG. 2), a sacrificial oxide etch that is very selective for silicon dioxide as opposed to silicon or the carbon of the multiwall nanotube 108 is performed. More particularly, the etch reaches underneath and between the existing silicon to remove the initial sacrificial oxide layer 704, the second sacrificial oxide layer 712, the first release region 740, and the second release region 746. Exemplary etches that may be employed include a HF acid vapor etch, a liquid HF acid etch, a buffered HF acid etch, and a fluorine based plasma etch. In such a fashion, as depicted in FIG. 2, the rotor 112 is spaced from the support structure 136 and the bottom silicon layer 706. Moreover, as also illustrated in FIG. 2, this release of the device 100 leaves a contiguous portion of the support structure 136 that spans from the substrate 706 to the top of the multiwall nanotube 108.

Finally, top and bottom portions of one or more outer walls of the multiwall nanotube 108 (e.g., the portions located between the support structure 136 and the rotor 112, and between the silicon wafer 706 and the rotor 112, as illustrated in FIG. 2) may be removed so as to facilitate rotation of the rotor 112 about the elongate axis of the multiwall nanotube 108. For example, as previously described, those portions may be mechanically sheared (i.e., broken) away and/or they may be removed by passing current through the multiwall nanotube 108 to vaporize the outer nanotube shells.

The exemplary method for fabricating the doubly-clamped, or doubly-supported, rotary device 100 that is described above with reference to FIGS. 7A-7Z is non-limiting. As will be understood by one of ordinary skill in the art, the process may varied in several ways. For example, once the multiwall nanotube 108 has been provided in the well 726 (as shown in FIG. 7S), but prior to applying the further oxide layer 738 (as shown in FIG. 7T), a layer of $SiN_x$ may first be conformally deposited (e.g., by PECVD, thermal CVD, or sputtering) and then isotropically etched with precise timing by an etching process that is selective for nitride as opposed to silicon, silicon dioxide, and the carbon of the multiwall nanotube 108. In this way, $SiN_x$ is placed around the portion of the multiwall nanotube 108 located in the portion of the well 726 formed in the bottom silicon layer 706. The multiwall nanotube 108 is thereby secured (i.e., firmly anchored) to the bottom silicon layer 706. The etch of the $SiN_x$ layer may be, for example, a fluorine based isotropic plasma etch (e.g., employing $CHF_3/O_2$), a fluorine based plasma etch, or a chlorine based isotropic plasma etch.

As another example, a silicon dioxide rotor 112 (rather than a silicon rotor 112) can be fabricated by employing silicon (rather than silicon dioxide) as a sacrificial release layer. To do so, one can switch the etching processes to the opposite selectivity. In fact, any materials may be used for the rotor 112, support structure 136, and sacrificial release layers, so long as conformal coating, anisotropic etching, and isotropic etching can be performed with good selectivity relative to the other materials.

In addition, the photoresist steps described above are only exemplary in nature, and not limiting. Many different types of photoresist and exposure techniques may be used. Moreover, patterning of various parts of the stair-stepped structure can be performed with either i) isotropic deposition followed by isotropic etching or ii) patterned resist and isotropic etching. For its part, the catalyst 736 may be patterned on the silicon wafer 706 first, before any layers are fabricated thereon.

The stair-stepped process described above achieves self-alignment of the rotary device 100 (i.e., the catalyst 736, and hence the multiwall nanotube 108, are well centered in the rotor 112), but that may alternatively be achieved through multiple lithographic steps. In addition, instead of using the above-described self-aligned nitride technique to create the stair-stepped configuration for the well 726, one may instead etch only a small tunnel so that the nanotube 108 fills the whole tunnel as it grows.

Finally, in an alternative method for fabricating the doubly-clamped, or doubly-supported, rotary device 100, the Stodola rotor 100 depicted in FIG. 6D is first built as described above with reference to FIGS. 6A-6D. The top of the silicon rotor 112 and the portion of the oxide release layer 604 right at the tip of the nanotube 108 may then be etched to expose the top of the multiwall carbon nanotube 108. Another release oxide (potentially similarly etched away at the nanotube 108 tip), followed by the silicon support structure 136, may then be deposited on the silicon rotor 112. Finally, a release etch to remove the appropriate portions of the release oxides may then be applied, as detailed hereinabove, to form the doubly-clamped, or doubly-supported, rotary device 100.

Exemplary Applications

Figure 8A:
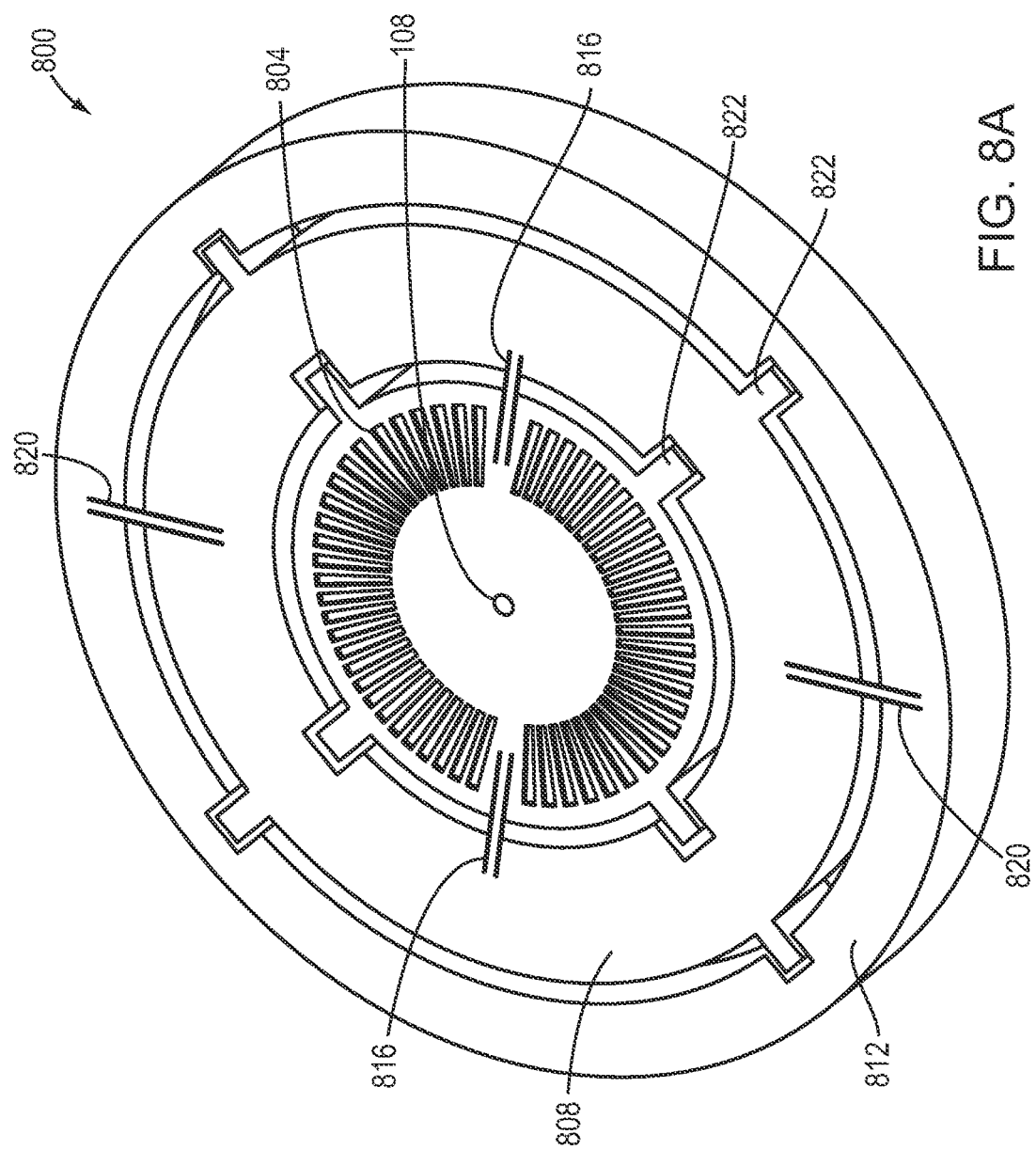
FIG. 8A depicts a top perspective view of the rotating elements for a DTG in accordance with one embodiment of the invention.
Figure 8B:
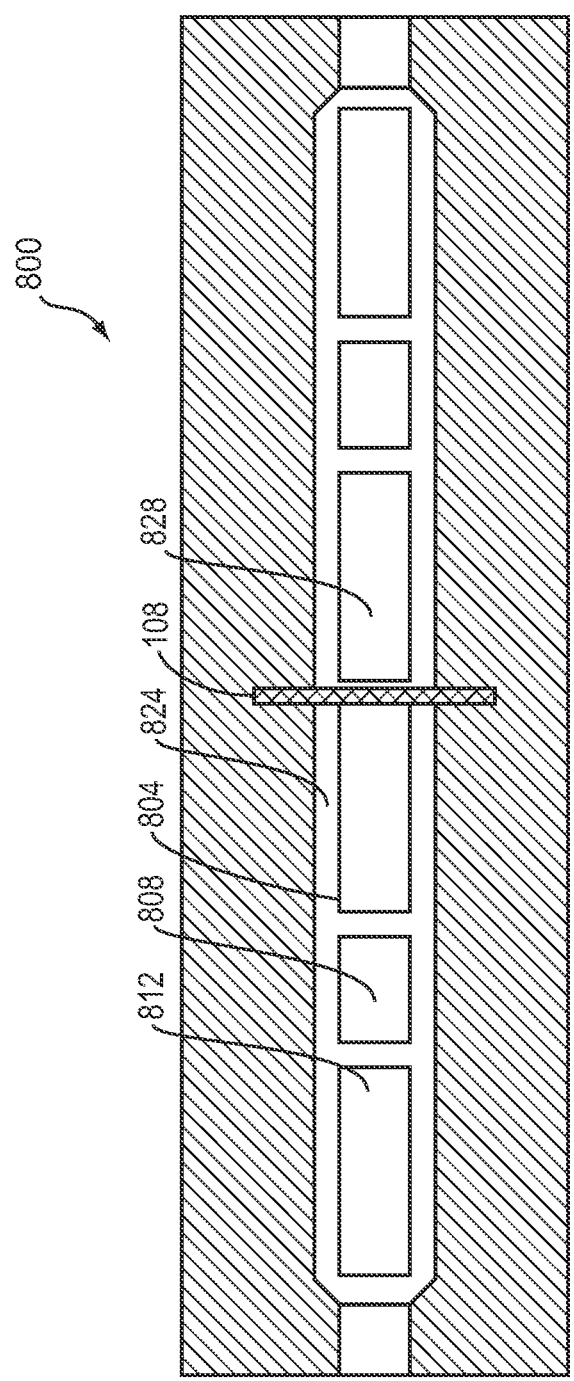
FIG. 8B depicts a cross-sectional view of the rotating elements of FIG. 8A.

The rotary device 100 described herein may be employed in a variety of applications. As a first example, the rotary device 100 may be employed in a DTG. FIG. 8A depicts a top perspective view of the rotating elements 800 for the DTG, while FIG. 8B depicts a cross-sectional view thereof. As illustrated, the DTG includes a drive hub 804, a gimbal 808, and a peripheral rotor 812. Flexures 816 (omitted for simplicity in FIG. 8B) couple the drive hub 804 to the gimbal 808, while flexures 820 (also omitted for simplicity in FIG. 8B) couple the gimbal 808 to the peripheral rotor 812. Stops 822 (again omitted for simplicity in FIG. 8B) are located between the drive hub 804 and the gimbal 808, and also between the gimbal 808 and the peripheral rotor 812. As will be understood by one of ordinary skill in the art, the stops 822 are used to limit or damp the deflection of the peripheral rotor 812.

As depicted, the drive hub 804 is coupled to a multiwall carbon nanotube 108, as described above. The multiwall nanotube 108 serves as the rotational bearing and axial support for the DTG. In addition, electrodes 140 or permanent magnets 145 may be coupled to top and/or bottom surfaces 824, 828 of the drive hub 804 such that the drive hub 804 may be electrostatically or electromagnetically rotated, for example as described above, by corresponding stator electrodes 144 or metal windings 146 disposed just above and/or below the top and/or bottom surfaces 824, 828 of the drive hub 804.

Initially, the rotating elements 800 of the DTG may consist of only the multiwall nanotube 108 and the rotor 112 described above, and the rotor 112 may then be patterned (e.g., with electron-beam or other nanolithography techniques) and etched (e.g., with reactive ion etching) so as to shape the drive hub 804, the gimbal 808, and the peripheral rotor 812. Alternatively, the rotor 112 described above may be patterned and etched to only shape the drive hub 804. In this latter case, the gimbal 808 and the peripheral rotor 812 may be separately manufactured and then coupled to one another and to the drive hub 804. For example, the peripheral rotor 812 and the gimbal 808 may be bonded to flexures 820, and the gimbal 808 and the drive hub 804 bonded to flexures 816.

In practice, a case (not shown) substantially encases the DTG components. As will be well understood by one of ordinary skill in the art, the drive hub 804 and the multiwall nanotube 108 are, in operation, caused to spin by the electrostatic or electromagnetic motor. When there is no displacement of the multiwall nanotube 108 in inertial space, the peripheral rotor 812 spins about and within a plane that is orthogonal to the long axis of the multiwall nanotube 108 (i.e., the spin axis of the nanotube 108). When, however, a torque is applied along an axis normal to the spin axis of the nanotube 108, the case moves while the peripheral rotor 812 tends to remain fixed with respect to inertial space. The change in the position of the peripheral rotor 812 with respect to the case may be sensed with one or more pick-offs and the peripheral rotor 812 then re-balanced back to its null position using one or more torquers and control electronics, in a closed loop operation. The electrical current supplied to the torquer(s) is generally proportional to the applied angular force.

Because the momentum and the rotational axis of the peripheral rotor 812 generally preserve their direction in inertial space, the DTG can suitably be used as, for example, an inertial guidance system. More specifically, the DTG can be used as an attitude control mechanism (e.g., to sense or measure the pitch, roll, and yaw attitude angles) in spacecraft or aircraft. Further details concerning DTGs, in general, may be found in U.S. Pat. No. 6,615,681, which is entitled "Hybrid Wafer Gyroscope" and the contents of which are hereby incorporated herein by reference in their entirety.

Advantageously, the use of the multiwall carbon nanotube 108 in the DTG, as opposed to, for example, ball bearings, leads to lower wear in the axial support and to lower friction. Even if the coefficient of friction is high, the small size of the multiwall nanotube 108 results in a lower consumption of power due to the short lever arm on which the friction is applied. In addition, in one embodiment, the multiwall carbon nanotube 108 is smooth. Jeweled bearings, in contrast, are typically rough and limit the performance of the DTG. A further advantage to the use of a multiwall carbon nanotube 108 is that it also reduces or eliminates bearing wobble, which is the dominant error in DTGs. In addition, if an electrically-conducting carbon nanotube 108 is employed, the rotor 112 can then be electrically grounded. This enables reliable electrical stability and noise; hence, gyroscope performance is improved.

Figure 9A:
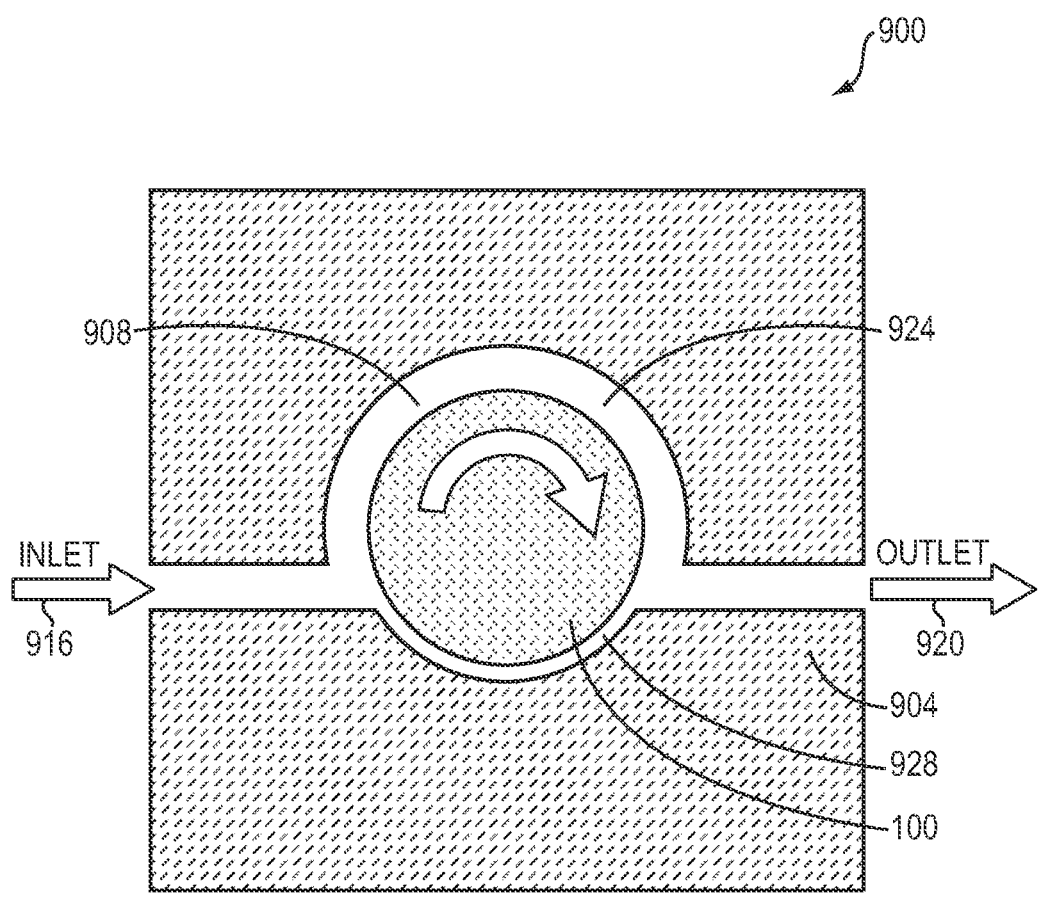
FIG. 9A depicts a Gaede vacuum pump in accordance with one embodiment of the invention.
Figure 9B:
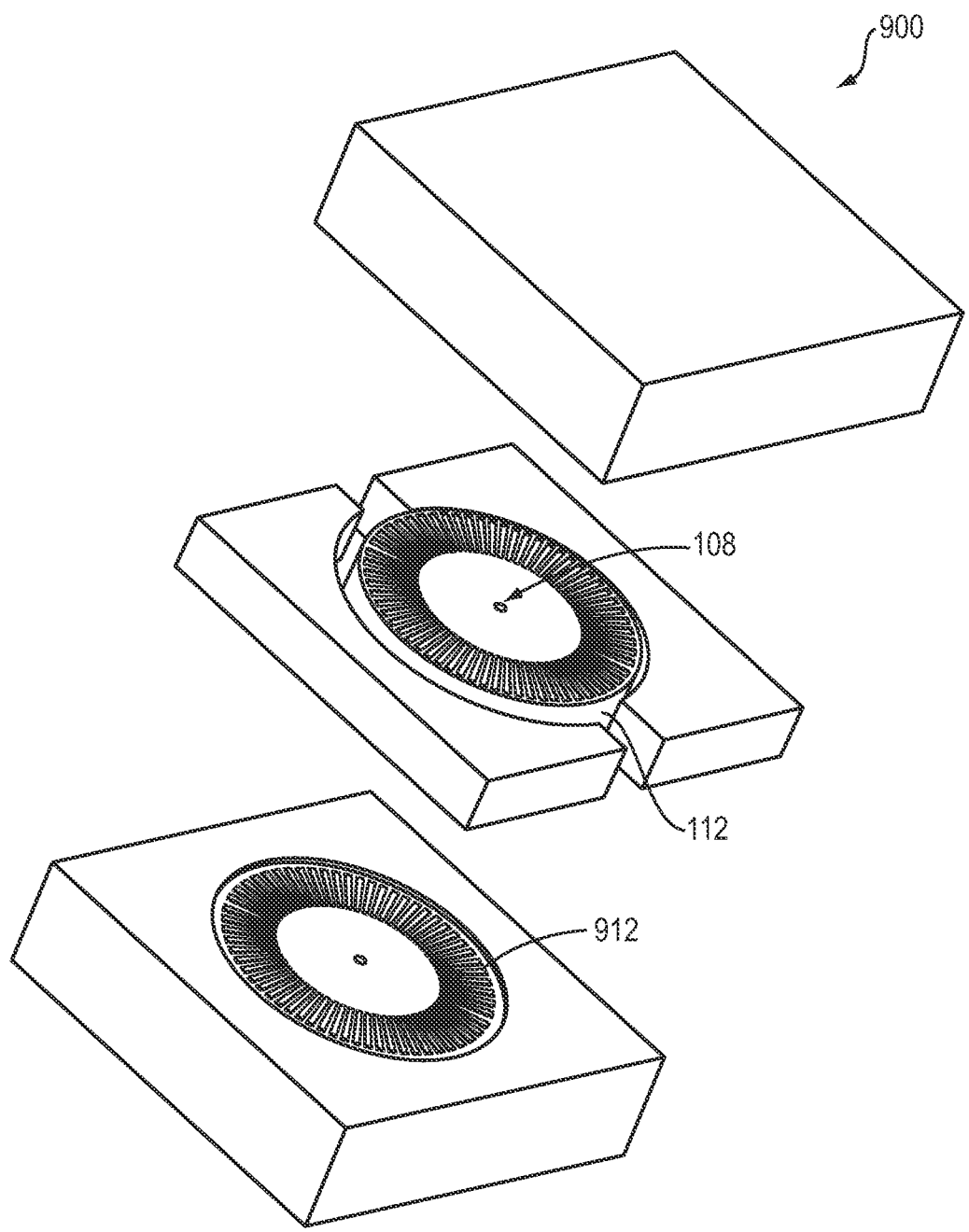
FIG. 9B depicts an exploded view of the Gaede vacuum pump of FIG. 9A.

As a second example, the rotary device 100 may be employed as part of a Gaede vacuum pump. FIG. 9A depicts one embodiment of a Gaede molecular flow pump 900, while FIG. 9B depicts an exploded view thereof. As most clearly depicted in FIG. 9A, the Gaede vacuum pump 900 includes a housing 904 in a cavity 908 of which is located the rotary device 100. As previously described, and as depicted in FIG. 9B, the rotary device 100 includes the rotor 112 coupled to the multiwall carbon nanotube 108. As also depicted in FIG. 9B, the Gaede vacuum pump 900 may also include a stator 912. The rotor 112 may be, for example, electrostatically actuated, or actuated in another manner as described above. The cavity 908 includes an inlet (or suction side) 916, an outlet (or pressure side) 920, and a channel 924 extending therebetween.

In one embodiment, gas at the inlet 916 is drawn into and along the channel 924 by the rapidly rotating rotor 112. More specifically, due to the collision of gas particles with the rotor 112 surface, the gas particles are communicated along the channel 924 from the inlet 916 to the outlet 920. With impeded flow path at the outlet 920, pressure builds in the channel 924. For molecular flows, the maximum pressure ratio of the gas pressure at the outlet 920 to the gas pressure at the inlet 916 is equal to $e^{bu}$, where u is the surface speed and b, a positive number, depends on geometry and gas properties.

Figure 9C:
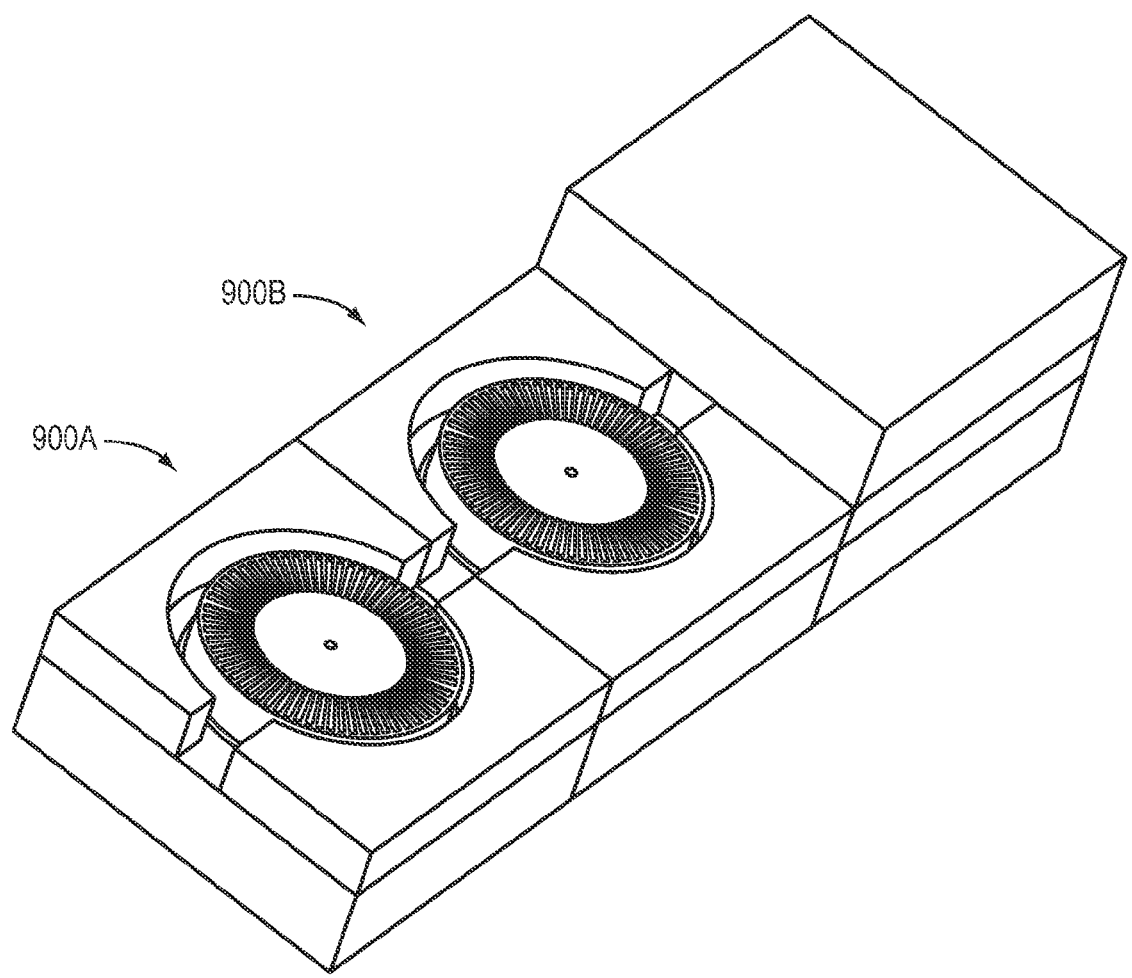
FIG. 9C depicts a cascade of two Gaede vacuum pumps in accordance with one embodiment of the invention.

Because of their small size, two or more Gaede vacuum pumps 900 can be cascaded, as illustrated in FIG. 9C, to achieve large pressure ratios. For example, vacua lower than one microtorr (i.e., $10^{-6}$ Torr) can be obtained.

In one embodiment, the rotor 112 is approximately 1 mm in diameter and approximately 100 μm thick, while the multiwall carbon nanotube 108 is approximately 100 nm in diameter. Clearances around the rotor 112 may range from 1 μm to 2 μm. The pumping channel 924 may be 25 μm to 100 μm wide and may extend, as illustrated in FIG. 9A, 180° about the periphery of the rotor 112 to separate high and low pressures. Assuming no leakage, the exponential nature of the pressure ratio (per Gaede vacuum pump 900) versus speed and channel 924 geometry yields very high pressure ratios. More particularly, for outlet 920 pressures ranging from 10 mTorr to 100 mTorr, ratios of the gas pressure at the outlet 920 to the gas pressure at the inlet 916 of ten to a hundred or more (per Gaede vacuum pump 900) may be achieved with a rotational speed of 1 million rpm (i.e., approximately 16,700 rotations/s). This rotational speed is made possible by the low-friction multiwall carbon nanotube bearing 108. In one embodiment, leakage through the remaining 180° of narrower channel 928 and the top and bottom faces of the rotor 112 limit achievable pressure ratios. For example, with a 100 µm pump chamber height and 1 µm annular and face gaps, the ratio of the gas pressure at the outlet 920 to the gas pressure at the inlet 916 (per Gaede vacuum pump 900) is approximately 10 and the leakage flow is roughly 10% of the forward flow.

Again, a grounded rotor 112 may be employed in this application to simplify drive electronics. Moreover, by adding the aforedescribed vanes 148 to the rotor 112 of the flow pump 900, a turbo-molecular flow pump 900 may be created.

In still other examples, the rotary device 100 may be employed as a flywheel in a flywheel energy storage mechanism, as an optical chopper to periodically interrupt a light beam (for example with the rotation of the aforedescribed vanes 148 through the light beam), as a turbine to extract energy from fluid flow, as a gas compressor to increase the pressure of a gas, and/or as a flow sensor to sense a rate of fluid flow. For example, the aforedescribed vanes 148 of the rotary device 100 may be pushed by a fluid and the rotary device 100 used to extract energy therefrom (in the case of a turbine) or used to drive a rotary potentiometer or similar device (in the case of a flow sensor). As another example, the vanes 148 of the rotary device 100 may be employed in an axial-flow compressor to accelerate a fluid.

Having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A method for fabricating a rotary device, comprising:
   providing a multiwall nanotube on a substrate;
   growing a conformal release layer on the substrate and around at least a portion of the multiwall nanotube, wherein the conformal release layer is grown after providing the multiwall nanotube on the substrate;
   depositing rotor material on the conformal release layer and around at least a portion of the multiwall nanotube; and
   removing at least a portion of the conformal release layer between surfaces of the substrate and the rotor material so as to space the rotor material from the substrate, but such that the rotor material remains coupled to the multiwall nanotube and is free to rotate about a long axis of the multiwall nanotube.

2. The method of claim 1, wherein providing the multiwall nanotube comprises growing the multiwall nanotube on the substrate.

3. The method of claim 2, wherein the multiwall nanotube is grown by PECVD on patterned catalyst particles.

4. The method of claim 1, wherein providing the multiwall nanotube comprises welding an arc-deposited or laser-ablated multiwall nanotube to the substrate.

5. The method of claim 1, wherein the release layer comprises silicon dioxide.

6. The method of claim 1, wherein the release layer is grown by PECVD.

7. The method of claim 1, wherein the rotor material comprises silicon.

8. The method of claim 1, wherein the rotor material is deposited by thermal CVD.

9. The method of claim 1, wherein the release layer is removed by etching the release layer with vapor hydrofluoric acid.

10. The method of claim 1 further comprising patterning and etching the rotor material so as to shape the rotor material.

11. The method of claim 1 further comprising patterning and etching drive electrodes on the rotor material.

12. The method of claim 1 further comprising removing at least a portion of an outer wall of the multiwall nanotube located between the surfaces of the substrate and the rotor material.

* * * * *